United States Patent
Esaka et al.

(10) Patent No.: US 10,489,353 B2
(45) Date of Patent: Nov. 26, 2019

(54) COMPUTER SYSTEM AND DATA MANAGEMENT METHOD

(71) Applicant: HITACHI, LTD., Tokyo (JP)

(72) Inventors: Tomonori Esaka, Tokyo (JP); Tetsuya Abe, Tokyo (JP); Yoshitaka Nakamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 322 days.

(21) Appl. No.: 15/539,375

(22) PCT Filed: Jan. 5, 2015

(86) PCT No.: PCT/JP2015/050059
§ 371 (c)(1),
(2) Date: Jun. 23, 2017

(87) PCT Pub. No.: WO2016/110936
PCT Pub. Date: Jul. 14, 2016

(65) Prior Publication Data
US 2018/0018346 A1     Jan. 18, 2018

(51) Int. Cl.
*G06F 16/182* (2019.01)
*G06F 16/27* (2019.01)
(Continued)

(52) U.S. Cl.
CPC ............ *G06F 16/183* (2019.01); *G06F 16/27* (2019.01); *G06F 17/40* (2013.01); *G06F 17/509* (2013.01)

(58) Field of Classification Search
CPC ...... G06F 16/183; G06F 16/182; G06F 16/27; G06F 17/30203; G06F 17/30283; G06F 17/30194; G06F 17/509; G06F 17/40
See application file for complete search history.

(56) References Cited

U.S. PATENT DOCUMENTS

| 6,523,036 B1* | 2/2003 | Hickman ............ G06F 16/27 707/704 |
| 2008/0010243 A1* | 1/2008 | Weissman .......... G06F 16/2455 |

(Continued)

FOREIGN PATENT DOCUMENTS

| JP | 2013-524358 A | 6/2013 |
| JP | 2013-257798 A | 12/2013 |
| JP | 2014-503086 A | 2/2014 |

OTHER PUBLICATIONS

English Translation of International Preliminary Report on Patentability Chapter I for WO-2016110936-A1 (PCT/JP2015050059), dated Nov. 7, 2017 (Year: 2017).*

(Continued)

*Primary Examiner* — James E Richardson
(74) *Attorney, Agent, or Firm* — Volpe and Koenig, P.C.

(57) ABSTRACT

A storage system includes N nodes (N is an integer, equal to or larger than 2) coupled to at least one data processing system. A plurality of tenant spaces, based on the N nodes, contain Y1 tenant spaces (Y1 is an integer, equal to or larger than 2 and equal to or smaller than N) for a first tenant. The Y1 tenant spaces are based on Y1 node groups in the N nodes. Each of the Y1 node groups contains Q1 or more nodes (Q1 is an integer, equal to or larger than 1). For the first tenant, the storage system provides, to each of the Y1 tenant spaces, data units multiplexed Y1 times. From a first load-source tenant space from among the Y1 tenant spaces, the storage system loads a first data unit group containing one or more data units to a first load-destination data processing system.

12 Claims, 22 Drawing Sheets

(51) Int. Cl.
*G06F 17/40* (2006.01)
*G06F 17/50* (2006.01)

(56) References Cited

U.S. PATENT DOCUMENTS

| | | | | |
|---|---|---|---|---|
| 2010/0325281 A1* | 12/2010 | Li | ............................ | G06F 16/27 709/226 |
| 2011/0289091 A1* | 11/2011 | Collins | ................ | G06F 16/2228 707/741 |
| 2012/0072397 A1 | 3/2012 | Esaka | | |
| 2012/0259813 A1 | 10/2012 | Takata et al. | | |
| 2013/0086270 A1* | 4/2013 | Nishikawa | ............. | G06F 9/5011 709/226 |
| 2014/0136779 A1* | 5/2014 | Guha | ..................... | G06F 9/5066 711/114 |
| 2014/0372484 A1* | 12/2014 | Baker | ...................... | G06F 16/27 707/781 |
| 2015/0120791 A1* | 4/2015 | Gummaraju | ......... | G06F 9/45558 707/823 |
| 2015/0278243 A1* | 10/2015 | Vincent | ................. | G06F 16/182 707/634 |

OTHER PUBLICATIONS

International Search Report for WO 2016/110936 A1, dated Feb. 17, 2015.

\* cited by examiner

FIG. 3

Stored file management table
2110

| Sensor ID 2111 | Sensor name 2112 | Data storage destination directory 2113 | File name 2114 | Current version 2115 | Write mode 2116 | File switching trigger 2117 |
|---|---|---|---|---|---|---|
| A1234561 | SA_01 | \\file_sync_share\SA_01\ | SA_01.txt | r0070 | Add | date |
| A1234562 | SA_02 | \\file_sync_share\SA_02\ | SA_02.txt | r0003 | Add | month |
| A1234563 | SA_03 | \\file_sync_share\SA_03\ | SA_03.txt | r0140 | New | — |
| ... | ... | ... | ... | ... | ... | ... |

FIG. 4

Storage management table
2310

| Data storage destination directory (2311) | Addition custom metadata (2312) | FSS server name (2313) |
|---|---|---|
| \\file_sync_share\SA_01\ | Data type: power, Primary tenant: tenantA_#1, Copy1 tenant: tenantA_#2, Keyword: keyword A | FSS server #1 |
| \\file_sync_share\SA_02\ | Data type: power, Primary tenant: tenantA_#1, Copy1 tenant: tenantA_#2, Keyword: keyword A | FSS server #1 |
| \\file_sync_share\SA_03\ | Data type: power, Primary tenant: tenantA_#1, Copy1 tenant: tenantA_#2, Keyword: keyword A | FSS server #1 |
| \\file_sync_share\SA_t\ | Data type: temperature, Primary tenant: tenantA_#1, Copy1 tenant: tenantA_#2, Keyword: keyword T | FSS server #1 |
| ... | ... | ... |

FIG. 5

Storage-destination tenant management table
3110

| IP address | APP name | Object storage name | Tenant space name |
|---|---|---|---|
| 10.198.229.124 | FSS client APP_A | Object storage #1 | tenantA_#1 |
| 10.198.230.126 | FSS client APP_B | Object storage #1 | tenantB_#2 |
| ... | ... | ... | ... |

Directory configuration management table
3120

| Directory path | Object storage name | Tenant space name | Object ID |
|---|---|---|---|
| \file_sync_share\SA_01\SA_01_r0070.txt | Object storage #1 | tenantA_#1 | AAA12345 |
| \file_sync_share\SA_02\SA_02_r0003.txt | Object storage #1 | tenantA_#1 | AAA12346 |
| \file_sync_share\SA_03\SA_03_r0140.txt | Object storage #1 | tenantA_#1 | AAA12347 |
| \file_sync_share\SA_t\SA_t_r0070.txt | Object storage #1 | tenantA_#1 | AAT01234 |
| ... | ... | ... | ... |

Metadata management table
4110

| Object ID 4111 | Object name 4112 | Object type 4113 | Object data protection level 4114 | Retention period (days) 4115 | Size (MB) 4116 | Custom metadata 4117 |
|---|---|---|---|---|---|---|
| AAA12345 | SA_01_r0070.txt | primary | 2 | 365 | 1.2 | Data type: power, Primary tenant: tenantA_#1, Copy1 tenant: tenantA_#2, Keyword: keyword A |
| AAA12345 | SA_01_r0070.txt | copy1 | 2 | 365 | 1.2 | Data type: power, Primary tenant: tenantA_#1, Copy1 tenant: tenantA_#2, Keyword: keyword A |
| AAA12346 | SA_02_r0003.txt | primary | 2 | 365 | 1.4 | Data type: power, Primary tenant: tenantA_#1, Copy1 tenant: tenantA_#2, Keyword: keyword A |
| AAA12346 | SA_02_r0003.txt | copy1 | 2 | 365 | 1.4 | Data type: power, Primary tenant: tenantA_#1, Copy1 tenant: tenantA_#2, Keyword: keyword A |
| BBB12361 | SB_01_r0050.txt | copy1 | 2 | 365 | 1.3 | Data type: power, Primary tenant: tenantB_#2, Copy1 tenant: tenantB_#1, Keyword: keyword B |
| BBB12361 | SB_01_r0050.txt | primary | 2 | 365 | 1.3 | Data type: power, Primary tenant: tenantB_#2, Copy1 tenant: tenantB_#1, Keyword: keyword B |
| ... | ... | ... | ... | ... | ... | ... |

FIG. 8

Tenant management table
4120

| Tenant space name | FSS server name | Object data protection level | Object type |
|---|---|---|---|
| tenantA_#1 | FSS server #1 | 2 | primary |
| tenantA_#2 | FSS server #1 | 2 | copy1 |
| tenantB_#1 | FSS server #1 | 2 | copy1 |
| tenantB_#2 | FSS server #1 | 2 | primary |
| ... | ... | ... | ... |

Hadoop situation table
5610

| Hadoop system name | Name space name | In-analysis | Processor usage rate (%) |
|---|---|---|---|
| Hadoop system #1 | Name space #1 | 1 | 75 |
| Hadoop system #2 | Name space #1 | 0 | 5 |
| Hadoop system #3 | Name space #1 | 0 | 10 |
| Hadoop system #4 | Name space #1 | 0 | 15 |
| Hadoop system #4 | Name space #2 | 0 | 15 |
| ... | ... | ... | ... |

Analysis situation management table
5410

| Tenant name | Copy-source tenant space name | Copy-destination Hadoop system name | Copy-destination namespace name | Status |
|---|---|---|---|---|
| tenantA | tenantA_#1 | Hadoop system #1 | Name space #1 | In-analysis |
| tenantB | tenantB_#2 | Hadoop system #2 | Name space #1 | In-copying |
| tenantC | tenantC_#1 | Hadoop system #1 | Name space #1 | Stand-by |
| tenantD | tenantD_#1 | Hadoop system #1 | Name space #2 | Analysis completed |
| ... | ... | ... | ... | ... |

Rearrangement management table
5510

| Object name | Primary | First copy | Second copy | Original DPL | Temporary DPL | Status |
|---|---|---|---|---|---|---|
| SA_01_r0070.txt | tenantA_#1 | tenantA_#2 | tenantX | 2 | 3 | Rearrangement reserved |
| SA_02_r0003.txt | tenantA_#1 | tenantA_#2 | tenantX | 2 | 3 | In-rearrangement |
| SA_03_r0140.txt | tenantA_#1 | tenantA_#2 | tenantX | 2 | 3 | Rearranged |
| SA_04_r0030.txt | tenantA_#1 | tenantA_#2 | tenantX | 2 | 3 | In-analysis |
| SA_05_r0030.txt | tenantA_#1 | tenantB_#1 | tenantX | 2 | 3 | Analyzed |
| SB_01_r0050.txt | tenantB_#2 | tenantB_#1 | tenantX | 2 | 3 | Cached |
| SB_02_r0050.txt | tenantB_#2 | tenantB_#1 | tenantX | 2 | 3 | Rearrangement cancellation reserved |
| SB_03_r0050.txt | tenantB_#2 | tenantB_#1 | tenantX | 2 | 3 | Rearrangement canceled |
| SB_04_r0050.txt | tenantB_#2 | tenantB_#1 | tenantX | 2 | 3 | Rearrangement canceled |
| SB_05_r0050.txt | tenantB_#2 | tenantB_#1 | tenantX | 2 | 3 | Rearrangement canceled |
| ... | ... | ... | ... | ... | ... | ... |

5511　5512　5513　5514　5515　5516　5517

COMPUTER SYSTEM AND DATA MANAGEMENT METHOD

TECHNICAL FIELD

The present invention generally relates to storage control of a storage system that includes multiple nodes.

BACKGROUND ART

Big data analysis that uses collected many pieces of data has been known as a process for collected data. The technology of PTL 1 has been known in relation to data collection and storage.

CITATION LIST

Patent Literature

[PTL 1] JP2013-257798

SUMMARY OF INVENTION

Technical Problem

In general, big data is an unstructured data group (e.g., many pieces of unstructured data). As a storage apparatus for unstructured data, a file storage apparatus has been known.

Unfortunately, the upper limit of the size of a file system provided by the file storage apparatus is, for example, about 1 PB (petabyte). To store data having at least this size, multiple file storage apparatuses are required. This requirement complicates data management.

Thus, for example, an object storage system is adopted that includes multiple nodes (storage apparatuses) in order to store unstructured data groups having several PBs. Instead of or in addition to the view of capacity, the object storage system can sometimes be adopted instead of or in addition to the file storage system (one or more file storage apparatuses).

Hadoop (R) is sometimes used for big data analysis. A file system that can be handled by Hadoop is an HDFS (Hadoop Distributed File System). Analysis target data is stored in the HDFS. In general, the HDFS is a WORM (Write Once Read Many) storage area. Accordingly, data in the HDFS cannot be updated. Consequently, in a use case where data to be analyzed is updated before data analysis, a storage system that stores analysis target data in an updatable manner is required besides a WORM storage area, such as the HDFS. Such a type of problem can occur in a data processing system other than Hadoop. Besides a storage area the data processing system refers to, the storage system that stores data to be processed in an updatable manner is sometimes called a "bridge storage system" hereafter.

In a case where the bridge storage system is adopted, data loading (copying) from the bridge storage system to the HDFS is required for the sake of big data analysis. Loading requires a long time owing to big data. Consequently, the performance of big data analysis is impaired. In a case where the HDFS resides in a public cloud, data loading from the bridge storage system to the HDFS is through a WAN (Wide Area Network), which particularly requires time.

The configuration of the object storage system is a scale-out-type multi-node structure in many cases. It can thus be considered that data loading time to the HDFS is reduced by high-speed data copying through wide bandwidth transfer using multiple nodes. However, there is a case where analysis target data groups are biasedly arranged to some nodes and the multi-node structure cannot be effectively utilized.

Many pieces of data that can be a target of big data analysis are arranged in a manner distributed to many nodes. It can thus be considered that data rearrangement is performed. However, the relationship between the data before rearrangement and the data after rearrangement becomes a problem. For example, as an example of rearrangement, data migration can be considered. However, data migration from a storage space for a first user to a storage space for a second user cannot be achieved in typical cases. This is because data for the first user becomes allowed to be referred to by the second user. Consequently, data groups may be biasedly arranged to some nodes. Data copying can be considered as another example of rearrangement. However, update of copy-source data impairs the consistency of the data, for example.

Solution to Problem

A computer system includes a storage system that includes N nodes (N is an integer, equal to or larger than 2) which are coupled to at least one data processing system. The storage system provides multiple tenant spaces that are multiple storage spaces based on the N nodes and store multiple data units of multiple tenants. The tenant spaces contain $Y_1$ tenant spaces ($Y_1$ is an integer, equal to or larger than 2 and equal to or smaller than N) for a first tenant. The $Y_1$ tenant spaces are based on Y node groups among the N nodes. Each of the $Y_1$ node groups contains $Q_1$ or more nodes ($Q_1$ is an integer, equal to or larger than 1). For the first tenant, the storage system arranges $Y_1$-time multiplexed data units in each of the $Y_1$ tenant spaces. From a first load-source tenant space among the $Y_1$ tenant spaces, the storage system loads a first data unit group which contains one or more data units to a first load-destination data processing system among one or more data processing systems. Each of the one or more data processing systems is a system that executes data processing (e.g., analysis process) using the loaded data unit group. The data processing system includes a storage device that stores therein the loaded data unit group, and can execute data processing using the data unit group stored in the storage device. The storage device may be a WORM storage device. For example, the data processing system may be a Hadoop system that has an HDFS (Hadoop Distributed File System). The data unit may be a file or an object, for example.

Advantageous Effects of Invention

Reduction in data loading time from the storage system to the data processing system can be expected.

BRIEF DESCRIPTION OF DRAWINGS

FIG. 3 is a diagram showing an example of a stored file management table.
FIG. 4 is a diagram showing an example of a storage management file.
FIG. 5 is a diagram showing an example of a storage-destination tenant management table.
FIG. 6 is a diagram showing a directory configuration management table.

FIG. 7 is a diagram showing an example of a metadata management table.

FIG. 8 is a diagram showing an example of a tenant management table.

FIG. 9 is a diagram showing an example of a Hadoop situation table.

FIG. 10 is a diagram showing an example of an analysis situation management table.

FIG. 11 is a diagram showing an example of a rearrangement management table.

DESCRIPTION OF EMBODIMENTS

Figure 1:
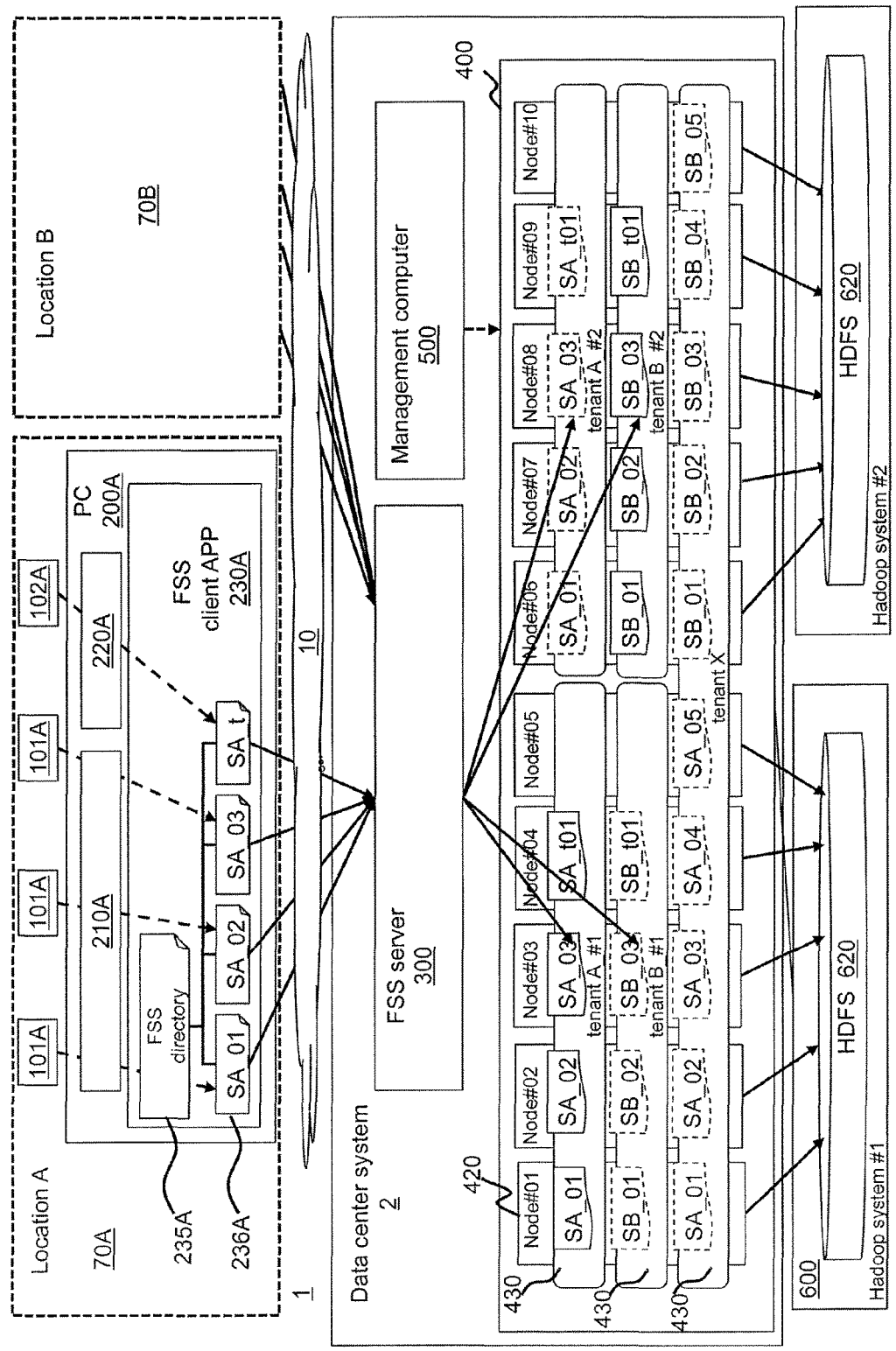
FIG. 1 shows a block diagram of a computer system according to Embodiment.

An Embodiment is hereinafter described.

In the following description, information is sometimes described in the representation of "xxx table". The information may, however, be represented in any data structure instead. That is, to indicate that information is represented independently of the data structure, "xxx table" may be called "xxx information". In the following description, the configuration of each table is an example. Alternatively, one table may be divided into two or more tables. All or some of the two or more tables may be a single table.

In the following description, an ID or a name is used as identification information on an element. Alternatively or additionally, another type of identification information may be used.

In the following description, in a case of description without discrimination between the same type of elements, a reference sign or a common reference number of a reference sign is used. In a case of description with discrimination between the same type of elements, the reference sign of the element is used or an ID allocated to the element is sometimes used instead of the reference sign.

In the following description, an I/O (Input/Output) request is a write request or a read request, and may be called an access request.

In the following description, a "storage unit" may be at least one storage device including a memory. For example, the storage unit may be at least a main storage device (typically, a volatile memory) between the main storage device and an auxiliary storage device (typically, a nonvolatile storage device). The storage unit may include at least one of a cache area (e.g., a cache memory or its partial area) and a buffer area (e.g., a buffer memory or its partial area).

In the following description, "PDEV" indicates a physical storage device, and may be typically a nonvolatile storage device (e.g., an auxiliary storage device). The PDEV may be, for example, an HDD (Hard Disk Drive) or SSD (Solid State Drive).

In the following description, "RAID" is an abbreviation of Redundant Array of Independent (or Inexpensive) Disks. A RAID group is made up of multiple PDEVs, and stores data according to the RAID level associated with this RAID group. The RAID group may be called a parity group. The parity group may be, for example, a RAID group that stores parities.

In the following description, a process is sometimes described with a "program" being adopted as the subject of the sentences. The program is executed by a processor (e.g., a CPU (Central Processing Unit)), thereby performing a predetermined process appropriately using a storage unit (e.g., a memory) and/or an interface device (e.g., a communication port). Consequently, the subject of a sentence concerning the process may be the processor. The process described with a program being adopted as the subject of the sentences may be a process to be executed by the processor, an apparatus including the processor, or a system. The processor may include a hardware circuit that performs a part of or the entire process. The program may be installed from a program source to an apparatus, such as a computer. The program source may be, for example, a program distribution server or a computer-readable storage medium. In a case where the program source is a program distribution server, the program distribution server includes a processor (e.g., a CPU) and a storage unit. The storage unit may further store a distribution program, and a distribution target program. The processor of the program distribution server may execute the distribution program to allow the processor of the program distribution server to distribute the distribution target program to another computer. In the following description, two or more programs may be realized as a single program. Alternatively, a single program may be realized as two or more programs.

In the following description, a management system may include one or more computers. More specifically, for example, in a case where a management computer displays information (more specifically, for example, the management computer displays information on its own display device, or the management computer transmits display information to a remote display computer), the management computer serves as a management system. For example, in a case where multiple computers realize a function analogous to that of the management computer, these computers (in a case where display is performed by a display computer, the display computer may be included) serve as the management system. The management computer (e.g., management system) may include an interface device coupled to an I/O system that includes a display system, a storage unit (e.g., a memory), and a processor coupled to the interface device and the storage unit. The display system may be a display device included in the management computer, a display computer coupled to the management computer. The I/O system may be I/O devices (e.g., a keyboard and a pointing device and a touch panel) included in the management computer, or a display computer coupled to the management computer, or another computer. The management computer's "displaying the display information" means displaying the display information on the display system. This may mean displaying the display information on the display device included in the management computer, or the management computer's transmitting the display information to the display computer (in the latter case, the display information is displayed by the display computer). The management computer's input and output of information may mean input and output from and to the I/O device included in the management computer, or input and output from and to a remote computer (e.g., the display computer) coupled to the management computer. Output of information may be display of information.

In the following description, "VOL" is an abbreviation of a logical volume, and may be a logical storage device. The VOL may be a real VOL (RVOL) or a virtual VOL (VVOL). The VOLs may be an online VOL that is provided for a host system coupled to a storage system providing the VOL, and an offline VOL that is not provided for the host system (unrecognizable from the host system). "RVOL" may be a VOL based on a physical storage unit included in a storage system that includes the RVOL (e.g., one or more RAID groups). "VVOL" may be at least one of external VOL (EVOL), a thin provisioning VOL (TPVOL), and a snapshot VOL. The EVOL is based on a storage space of an external storage system (e.g., VOL), and may be a VOL in conformity with a storage virtualization technology. The TPVOL includes multiple virtual areas (virtual storage areas), and may be a VOL in conformity with a capacity virtualization technology (typically, Thin Provisioning). The snapshot VOL may be a snapshot VOL provided as a snapshot of an original VOL. The TPVOL may be, typically, an online VOL. The snapshot VOL may be an RVOL. "Pool" is a logical storage area (e.g., a group of multiple pool VOLs), and may be provided on a usage-by-usage basis. For example, the pool may be at least one type of the TP pool and the snapshot pool. The TP pool may be a storage area that includes multiple real areas (real storage area). A real area may be allocated from the TP pool to a virtual area of the TPVOL. The snapshot pool may be a storage area that stores therein data evacuated from an original VOL. One pool may be used as a TP pool and a snapshot pool. "Pool VOL" may be a VOL that serves as a configuration element of a pool. The pool VOL may be an RVOL or an EVOL. The pool VOL may be, typically, an offline VOL.

In the following description, "tenant" is a user (e.g., a corporation) that uses a service, such as a big data analysis. "Tenant space" is a storage space (e.g., VOL) that stores therein the tenant's data. "Data protection level" is the redundancy of data. For example, the data protection level of an object is the number of identical objects, and is the number of copies 1 (original). For example, an object with a data protection level "5" encompasses an original object and four copied objects, that is, total five objects (quintupled objects).

FIG. 1 shows a block diagram of a computer system according to Embodiment.

The computer system 1 includes multiple tenant systems 70, a data center system 2, and multiple (or a single) Hadoop system(s) 600. The tenants include, for example, tenants A and B. Thus, the tenant systems 70 may be, for example, a tenant system 70A in a location A of the tenant A, and a tenant system 70B in a location B of the tenant B. In the following description, "A" is assigned to the reference sign or ID of an element pertaining to the tenant A, and "B" is assigned to the reference sign or ID of an element pertaining to the tenant B. Description is hereinafter made mainly with an example of the tenant system 70A. However, the description of the tenant system 70A is applicable to another tenant system 70.

The tenant system 70A includes a sensor system, and a PC (Personal Computer) 61A. The sensor system is an example of a data source system, and includes multiple sensors (examples of data sources). The sensors (measurement devices) may be a group of the same type of sensors or include different types of sensors. In this Embodiment, the sensors include multiple (or a single) smart meter(s) 101A and a single (or multiple) temperature sensor(s) 102A. The PC 200A is an example of a client system and may be at least one computer. The PC 200A executes application programs (hereinafter APPs) in conformity with the types of sensors, for example, an APP 210A for the smart meter, and an APP 220A for the temperature sensor. The PC 200A executes a client APP 230A for File Sync & Share (hereinafter FSS). The FSS client APP 230A manages an FSS directory 235A that is a directory for FSS. The FSS directory 235A contains multiple files 236A associated with the respective sensors. In a single file 236A, data from the sensor associated with this file 236A is stored by the FSS client APP 230A. The FSS client APP 230A executes a synchronization process for the files 236A in the FSS directory 235A with an FSS server 300. For example, the FSS client APP 230A transmits the data stored in the file 236A to the data center system 2 via a communication network, such as a WAN 10. That is, the data in the file 236A is not in the PC 200A but is in the data center system 2 instead.

The data center system 2 includes the FSS server 300, an object storage system 400, and a management computer 500.

The FSS server 300 includes one or more computers (FSS nodes). The FSS server 300 stores therein data from the PC 200A in the object storage system 400.

The object storage system 400 includes N storage nodes (hereinafter nodes) 420 (N is an integer of two or more). The node 420 is a storage apparatus. A tenant space 430 is provided on the basis of one or more nodes 420. The object storage system 400 provides multiple tenant spaces 430.

The management computer 500 is an example of a management system, and manages at least the object storage system 400. The management computer 500 transmits a request for creating a tenant space 430 to the object storage system 400, thereby creating the tenant space 430. For one tenant, on the basis of the number N of nodes 420 and the data protection level Y (Y is the number of copies C+1) for this tenant, the tenant spaces 430 the number of which is the same as Y are created. For example, the data protection level for the tenant A is "2". Accordingly, two tenant spaces 430A are created. Irrespective of the data protection level and the number of tenants of each tenant, a tenant space (hereinafter a common space) 430X common to all the tenants is also created. In the shown example, the common space 430X extends over all the (N) nodes 420. Alternatively, the length of the common space 430X (the number of nodes 420 over which the common space 430X extends) may be less than N (e.g., 1).

A Hadoop system 600 may be an example of the data processing system, and has an HDFS (Hadoop Distributed File System) 620.

The overview of the configuration has thus been described. It is not necessary that one object storage system is provided for multiple locations. For example, for each location, the object storage system (or a storage system other than the object storage system (e.g., a file storage system)) may be adopted; instead of the FSS server 300, another type of server may be adopted.

Hereinafter, the first smart meter 101A is exemplified as one data source, and an overview of data flow is described.

Every time the APP 210A for the smart meter receives data containing a measured value from the first smart meter 101A, the data is accumulated in a cache area (not shown) of the PC 200A. The FSS client APP 230A stores the data accumulated in the cache area (the data from the first smart meter 101A), in a file "SA_01" in the FSS directory 235. More specifically, the FSS client APP 230A adds custom metadata associated with a file "SA_01" to data (data main body) stored in a file "SA_01.txt", and transmits, to the data center system 2, a write request of a data set containing the data main body and the custom metadata (a write request designating a file name "SA_01.txt"). The custom metadata is extended metadata, and may contain, for example, a metric of a value contained in the data main body (e.g., power), a storage-destination tenant space name for the primary (original) data main body, a storage-destination tenant space name for a copied data main body, and a keyword.

The FSS server 300 in the data center system 2 receives a write request designating the file name "SA_01.txt". The FSS server 300 transmits, to the object storage system 400, a write request designating a tenant space "tenantA_#1" associated with the transmission-source FSS client APP 230A (a write request which contains the file name "SA_01.txt" and whose write target is a data set).

The object storage system 400 receives the write request issued by the FSS server 300, and stores the write-target data main body in the object "SA_01.txt" (main body) in the tenant space 430A associated with the tenant A, on the basis of the file name "SA_01.txt" designated by the write request, the custom metadata associated with the write-target data main body, and the data protection level of the object associated with the file name"SA_01.txt". For example, the data main body is stored in the object "SA_01.txt" in the primary tenant space "tenantA_#1". A copy of the data main body is stored in the object "SA_01.txt" in a copy tenant space "tenantA_#2". The copy of the data main body may be stored in the common space 430X on the basis of the data protection level associated with the data main body. The primary tenant space or the primary object may vary with respect to each tenant or object. In this Embodiment, the primary tenant space is defined on a tenant-by-tenant basis.

Thus, the data main body from the identical location A is Y-time multiplexed according to the data protection level Y of the data main body in the Y tenant spaces 430A (and 430X) including different node groups (one or more nodes). Y is an integer, between 2 and N inclusive. This is analogously applicable to another location B. Here, in this Embodiment, a group of objects (object data main body) associated with the identical tenant (identical location) is sometimes called "object group". The value of Y may be common to all the tenants or any value on a tenant-by-tenant basis.

Data in at least one object in the object group in the tenant space 430 is loaded in any of one or more Hadoop systems 600 via a LAN (Local Area Network) or a WAN.

In this Embodiment, for one tenant, on the basis of the number N of nodes 420 and the data protection level Y for this tenant, the Y tenant spaces 430 are distributed to the N nodes 420 with respect to this tenant. The length of one tenant space is the quotient Q of N/Y. The Y tenant spaces 430 may have the same length. Alternatively, at least one tenant space 430 may have a length larger than Q. The Y tenant spaces 430 are distributed to the different Y node groups (Q nodes 420). For example, as shown in the diagram, for each of the tenants A and B, N=10 and Y=2. Consequently, two tenant spaces are created. The two tenant spaces are distributed to the different two node groups (five nodes). In this Embodiment, for each tenant, the load-source tenant space for the Hadoop system 600 may be a primary tenant space, or a tenant space with the lowest load (e.g., a tenant space based on the node group with the lowest load). Primary tenant spaces may be defined for the respective tenants so that these primary tenant spaces associated with the respective tenants are based on node groups that can be different as much as possible. Data can be transferred in parallel from many nodes to the one or more Hadoop systems 600. For example, data load from nodes #01 to #05 on which the tenant space "tenantA_#1" of the tenant A is based to the Hadoop system 600, and data load from nodes #06 to #10 on which a tenant space "tenantB_#2" is based to the Hadoop system 600 can be performed in parallel. In other words, the degree of biased arrangement of data load source nodes to some nodes can be reduced. Consequently, the time of data loading to the one or more Hadoop systems 600 can be reduced. For example, the load destination of the data in the tenant space "tenantA_#1" (nodes #01 to #05) may be the Hadoop system #1, and the load destination of the data in the tenant space "tenantB_#2" (nodes #06 to #10) may be the Hadoop system #2. In this case, it is unnecessary that one node diverges the data load destinations. Consequently, it can be expected that the data loading time can be further reduced.

As a method of preventing the data load source nodes from being biasedly arranged to some nodes, a method can be considered that, irrespective of the data protection level, each tenant space extends over all the nodes (N nodes) 420. However, this increases the probability that the primary objects of different tenants reside in the same node. For example, in a case where analysis only using data on specific type of sensors (e.g., the temperature sensors 102A and 102B) for the tenants A and B is required, the possibility that pieces of data on the specific type of sensors are arranged in the same node can increase. Accordingly, if the Hadoop system is different on a tenant-by-tenant basis, the probability that one node diverges the data load destinations increases. Consequently, the tenant space arrangement in conformity with the view of this Embodiment contributes better to reduction in data loading time.

In this Embodiment, the object (data main body) can be rearranged in the object storage system 400 using the custom metadata associated with the object (file). Thus, concentration of data load sources to the Hadoop system 600 can be alleviated.

For example, in a case where all the Hadoop systems 600 are in the analysis process, data is not required to be loaded to any Hadoop system 600. This is because the analysis process using the data is not immediately performed even if the data is loaded. Consequently, a time during which data loading is not required (vacant time) can be secured. In this vacant time, next load target objects are allowed to be copied (distributed) to the common space 430X. For example, in a case where J objects (J is an integer of two or more) that are the next load targets are concentrated in one node, at least (J−1) objects among the J objects may be copied to the (J−1) nodes on which the common space 430X is based. In the next loading, J objects are loaded from different J nodes in parallel. Thus, the degree of parallelism can be maximized. In a case where J objects are concentrated in one node, at least (J−1) objects may be temporarily copied to the common space 430X and then at least (J−1) objects may be loaded irrespective of the presence of vacant time. However, this causes overhead of temporarily copying to the common space 430X. Consequently, the total time including the data loading time can be long. It is thus preferable that object copying to the common space 430X be performed in the vacant time.

This Embodiment is hereinafter described in detail.

Figure 2:
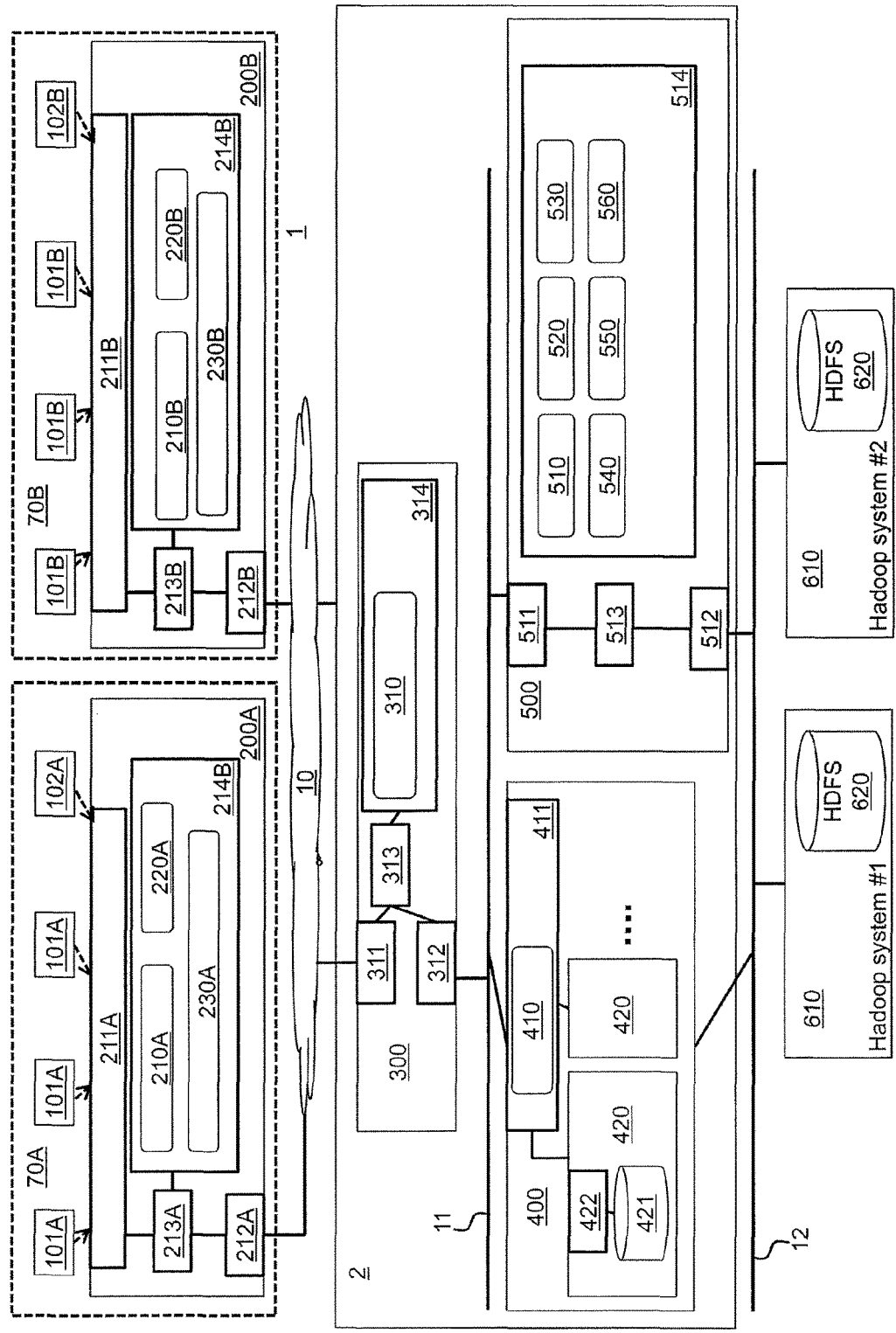
FIG. 2 is a configuration diagram of the computer system.

FIG. 2 is a configuration diagram of the computer system 1.

The computer system 1 includes the multiple tenant systems 70, the data center system 2, and the multiple (or a single) Hadoop system(s) 600.

The tenant system 70 includes the sensor system (smart meters 101 and temperature sensor 102), and the PC 200. The PC 200 and the data center system 2 are coupled to each other via a communication network, such as the WAN 10.

The smart meter 101 measures the electricity usage or the like, and transmits data (measured data) containing a measured value to the PC 200 through wireless communication or the like. The temperature sensor 102 measures the temperature, and transmits data (measured data) containing a measured temperature to the PC 200 through wireless communication or the like.

The PC 200 includes a first I/F (interface device) 211 that communicates with the sensor system, a second I/F 212 that communicates with the data center system 2, a storage unit 214, and a processor 213 coupled to these elements. The storage unit 214 stores therein APPs for the sensors (the APP 210 for the smart meters, and the APP 220 for the temperature sensor), and an FSS client APP 230. These APPs are executed by the processor 213.

The APPs for the sensors (210 and 220) receive measured data, and store the data in a cache area in the storage unit 214. The APPs for the sensors (210 and 220) store the measured data in a file (a file in the FSS directory 235) associated with the transmission source of the measured data.

The FSS client APP 230 executes a synchronization process for the FSS directory 235 (files 236 in the FSS directory 235) with the FSS server 300.

The data center system 2 includes the FSS server 300, the object storage system 400, and the management computer 500. The FSS server 300, the object storage system 400, and the management computer 500 are coupled via a communication network (e.g., LAN). The object storage system 400, the management computer 500, and the Hadoop system 600 are coupled to each other via a communication network 12 (e.g., LAN or WAN). The communication networks 11 and 12 may be the identical communication network.

The FSS server 300 includes a first I/F 311 that communicates with the PC 200, a second I/F 312 that communicates with the object storage system 400 and the management computer 500, a storage unit 314, and a processor 313 coupled to these elements. The storage unit 214 stores therein an FSS server program 310. This program is executed by the processor 313. The FSS server program 310 performs a synchronization process for the FSS directory 235 (the files 236 in the FSS directory 235) through communication with the FSS client APP 230.

The object storage system 400 includes an interface apparatus 411 and multiple nodes 420.

The interface apparatus 411 is coupled to the communication network 11, and executes an object storage program 410, thereby storing data from the FSS server 300 in the node 420.

The node 420 includes a controller 422, and a PDEV group 421 (one or more PDEVs). The controller 422 receives the object (data main body) via the interface apparatus 411, and stores the object in the PDEV group 421. The PDEV group 421 may include one or more RAID groups.

The management computer 500 includes a first I/F 511 that communicates with at least one of the FSS server 300 and the object storage system 400, a second I/F 512 that communicates with at least one of the Hadoop system 600 and the object storage system 400, and a storage unit 514, and a processor 513 coupled to these elements. The storage unit 514 stores therein an FSS management program 510, an object storage management program 520, a metadata management program 530, a dataflow management program 540, a rearrangement management program 550, and a Hadoop management program 560. These programs are executed by the processor 513.

The Hadoop system 600 includes the HDFS 620. The Hadoop system 600 executes an analysis process using data stored in the HDFS 620.

FIG. 3 is a diagram showing an example of a stored file management table.

A stored file management table 2110 is stored in the storage unit 214 of the PC 200, and is managed with respect to each of the APPs for sensors. The table 2110 shown in the diagram is a table managed by the APP 210 for the smart meter. The stored file management table 2110 contains records for the respective sensors. Each record stores therein a sensor ID 2111, a sensor name 2112, a data storage destination directory 2113, a file name 2114, a current version 2115, a write mode 2116, and a file switching trigger 2117.

The sensor ID 2111 is the ID of a sensor. The sensor name 2112 is the name of the sensor. The data storage destination directory 2113 is a path name to a directory that contains a file and is associated with the sensor. The file name 2114 is a common part of the name of a file associated with the sensor. That is, in this Embodiment, individual directories for the respective sensors reside in the FSS directory 235. In each individual directory, a file (e.g., a text file) that stores a value in the measured data resides. The current version 2115 is information that represents the current version of a file associated with the sensor. The write mode 2116 is information that represents the write mode associated with the sensor. For example, the write mode "Add" indicates that a data main body is added to the file. The write mode "New" indicates that measured data cannot be added to the file and a new file containing a measured data group from the sensors (one or more pieces of measured data) is newly created. The file name may be a combination of the common part indicated by the file name 2114 and the version. The addition target data main body is stored in the file indicated by the current version 2115. The file switching trigger 2117 is information that represents the switching trigger of the version of the file associated with the sensor. For example, a file switching trigger "date" indicates that the version of the file is switched every day. A file switching trigger "month" indicates that the version of the file is switched every month.

FIG. 4 is a diagram showing an example of a storage management table.

A storage management table 2310 is a table that is stored in the storage unit 214 of the PC 200 and is managed by the FSS client APP 230. The storage management table 2310 contains records for the respective directories. Each record stores a data storage destination directory 2311, an addition custom metadata 2312, and an FSS server name 2313.

The data storage destination directory 2311 is a path name to an individual directory. The addition custom metadata 2312 is custom metadata to be added to the data main body to be stored in the individual directory. The custom metadata contains information that defines the tenant space, and information pertaining to the content of data. The custom metadata contains, for example, the type of the value contained in the data from the sensor, the name of the primary tenant space (and the copied tenant space) that stores the data, and the keyword of the data. In a case where the data protection level is "1", the name of the copied tenant space is not required. The FSS server name 2313 is the name of the FSS server 300 that is the transmission destination of the data to be stored in the individual directory. That is, the data center system 2 may reside for each tenant. Alternatively, multiple servers (which may be FSS or not FSS) associated with the respective tenants may reside in a single data center system 2.

FIG. 5 is a diagram showing an example of a storage-destination tenant management table.

A storage-destination tenant management table 3110 is a table that is stored in the storage unit 314 of the FSS server 300 and is managed by the FSS server program 310. The storage-destination tenant management table 3110 contains records for the respective FSS client APPs 230. Each record stores an IP address 3111, an APP name 3112, an object storage name 3113, and a tenant space name 3114.

The IP address 3111 is information representing the IP address of the PC 200 that executes the FSS client APP 230. The APP name 3112 is the name of the FSS client APP 230. The object storage name 3113 is the name of the object storage system 400 that is the storage destination of data from the FSS client APP 230. The tenant space name 3114 is the name of the tenant space that is the storage destination of data from the FSS client APP 230.

FIG. 6 is a diagram showing a directory configuration management table.

A directory configuration management table 3120 is a table that is stored in the storage unit 314 of the FSS server 300 and is managed by the FSS server program 310. A directory configuration management table 3120 is a table that manages the correspondence relationship between the files on the file system and the objects on the object storage system 400. More specifically, for example, the directory configuration management table 3120 contains records for the respective directory paths (paths to files). Each record stores a directory path 3121, an object storage name 3122, a tenant space name 3123, and an object ID 3124.

The directory path 3121 is the name (path name) of the directory path. The object storage name 3122 is the name of the object storage system 400 that stores therein the object associated with the directory path (file). The tenant space name 3123 is the name of the tenant space that stores the object associated with the directory path (file). The object ID is the object ID associated with the directory path (file).

FIG. 7 is a diagram showing an example of a metadata management table.

A metadata management table 4110 is a table that is stored in a storage unit (not shown) of the interface apparatus 411 in the object storage system 400 and is managed by the object storage program 410. The metadata management table 4110 contains records for the respective objects. Each record stores an object ID 4111, an object name 4112, an object type 4113, an object data protection level 4114, a retention period 4115, a size 4116, and custom metadata 4117.

The object ID 4111 is the ID of an object. The object name 4112 is the name of the object. The object type 4113 is information that represents the type of the object. The object type "primary" indicates that the object is a primary object. The object type "copyR" indicates an R-th copied object (R is an integer, between 1 and (P−1) inclusive). The object data Protection level 4114 is the data protection level (the number of copies+1) of the object. The retention period 4115 is information that indicates the period during which the object is held. The size 4116 is information that indicates the size of the object. The custom metadata 4117 is custom metadata on the object. The custom metadata 4117 of the object has the same value as the addition custom metadata 2312 associated with the object does.

The object stored in the tenant space may be a set of the object data main body and the custom metadata, or only the object data main body. In the latter case, the custom metadata may be stored in the metadata management table 4110 shown in FIG. 7. That is, it is only required that the object data main body and the custom metadata are associated with each other.

FIG. 8 is a diagram showing an example of a tenant management table.

A tenant space management table 4120 is a table that is stored in the storage unit (not shown) of the interface apparatus 411 in the object storage system 400 and is managed by the object storage program 410. The tenant space management table 4120 contains records for the respective tenant spaces. Each record stores a tenant space name 4121, an FSS server name 4122, an object data protection level 4123, and an object type 4124.

The tenant space name 4121 is the name of a tenant space. The FSS server name 4122 is the name of an FSS server that stores data in the tenant space. The object data protection level 4123 is the data protection level of an object to be stored in the tenant space. The object type 4124 is information that represents the type of the object.

FIG. 9 is a diagram showing an example of a Hadoop situation table.

A Hadoop situation table 5610 is a table that is stored in the storage unit 514 of the management computer 500 and is managed by the Hadoop management program 560. The Hadoop situation table 5610 contains records for the respective Hadoop systems. Each record stores a Hadoop system name 5611, a namespace name 5612, in-analysis 5613, and a processor usage rate 5614.

The Hadoop system name 5611 is the name of a Hadoop system. The namespace name 5612 is the name of the namespace (file system space) provided by the Hadoop system 600. The in-analysis 5613 is a flag indicating whether the Hadoop system 600 is in analysis or not. An in-analysis "1" indicates that the state is being subjected to the analysis process, and an in-analysis "0" indicates that the state is not being subjected to the analysis process. The processor usage rate 5614 is information that represents the usage rate (%) of the processor in the Hadoop system 600.

FIG. 10 is a diagram showing an example of an analysis situation management table.

An analysis situation management table 5410 is a table that is stored in the storage unit 514 of the management computer 500 and is managed by the dataflow management program 540. The analysis situation management table 5410 contains records for the respective tenants. Each record stores a tenant name 5411, a copy-source tenant space name 5412, a copy-destination Hadoop system name 5413, a copy-destination namespace name 5414, and a status 5415.

The tenant name 5411 is the name of a tenant. The copy-source tenant space name 5412 is the name of the tenant space that is the copy-source (load-source) of processing target (analysis target) data. The copy-destination Hadoop system name 5413 is the name of the Hadoop system 600 that is the copy destination (load destination) of the processing target data. The copy-destination namespace name 5414 is the name of the namespace that is the copy destination of the processing target data. The status 5415 is information that represents the status of the tenant processing target data. The status "In-analysis" indicates that the processing target data is being subjected to the analysis process in the Hadoop system 600. The status "In-copying"

indicates that the processing target data is being copied (loaded) from the copy-source tenant space to the copy-destination namespace (HDFS). The status "Stand-by" indicates that all the Hadoop systems 600 are standing by due to the analysis process (in vacant time). The status "Analysis completed" indicates that the analysis process for the processing target data has been completed. The value of the status 5415 may transition in the order of "Stand-by", "In-copying", "In-analysis", and "Analysis completed".

FIG. 11 is a diagram showing an example of a rearrangement management table.

A rearrangement management table 5510 is a table that is stored in the storage unit 514 of the management computer 500 and is managed by the rearrangement management program 550. The rearrangement management table 5510 contains records for the respective objects. Each record stores an object name 5511, a primary 5512, a first copy 5513, a second copy 5514, an original DPL 5515, a temporary DPL 5516, and a status 5517.

The object name 5511 is the name of the object. The primary 5512 is the name of the primary tenant space that stores the object. The first copy 5513 is the name of the first copied tenant space that stores the object. The second copy 5514 is the name of the second copied tenant space that stores the object. The original DPL 5515 is the data protection level of the original. The maximum value of the original DPL 5515 may be the number of tenant spaces prepared for the associated tenants. The temporary DPL 5516 is a temporary data protection level. The maximum value of the temporary DPL 5516 may be the sum of the maximum value of the original DPL 5515 and the number of common spaces 430X. The status 5517 is information that represents the status pertaining to object rearrangement. The status "Rearrangement reserved" indicates that object rearrangement has already been reserved. The status "In-rearrangement" indicates that the object is being rearranged. The status "Rearranged" indicates that the object rearrangement has already been completed. The status "In-analysis" indicates that the object is being subjected to the analysis process. The status "Analyzed" indicates that the object analysis process has already been completed. The status "Cached" indicates that the object is cached in the common space 430X. The status "Rearrangement cancellation reserved" indicates that object rearrangement cancellation has already been reserved. The status "Rearrangement canceled" indicates that object rearrangement has already been canceled. The object associated with the status "Cached" has already been in the common space 430X. Consequently, the object can be transferred from the common space 430X to the Hadoop system 600 without rearrangement in the common space 430X.

In this Embodiment, for the sake of facilitating description, the data protection level is "2" for every tenant. Consequently, the number of tenant spaces is two for one tenant. The number of common spaces 430X is one. Consequently, the maximum value of the original DPL 5515 is "2". The maximum value of the temporary DPL 5516 is "3". The number of columns of "R-th copy" (R is an integer of one or more) is two.

The processes performed in this Embodiment are described.

Figure 12:
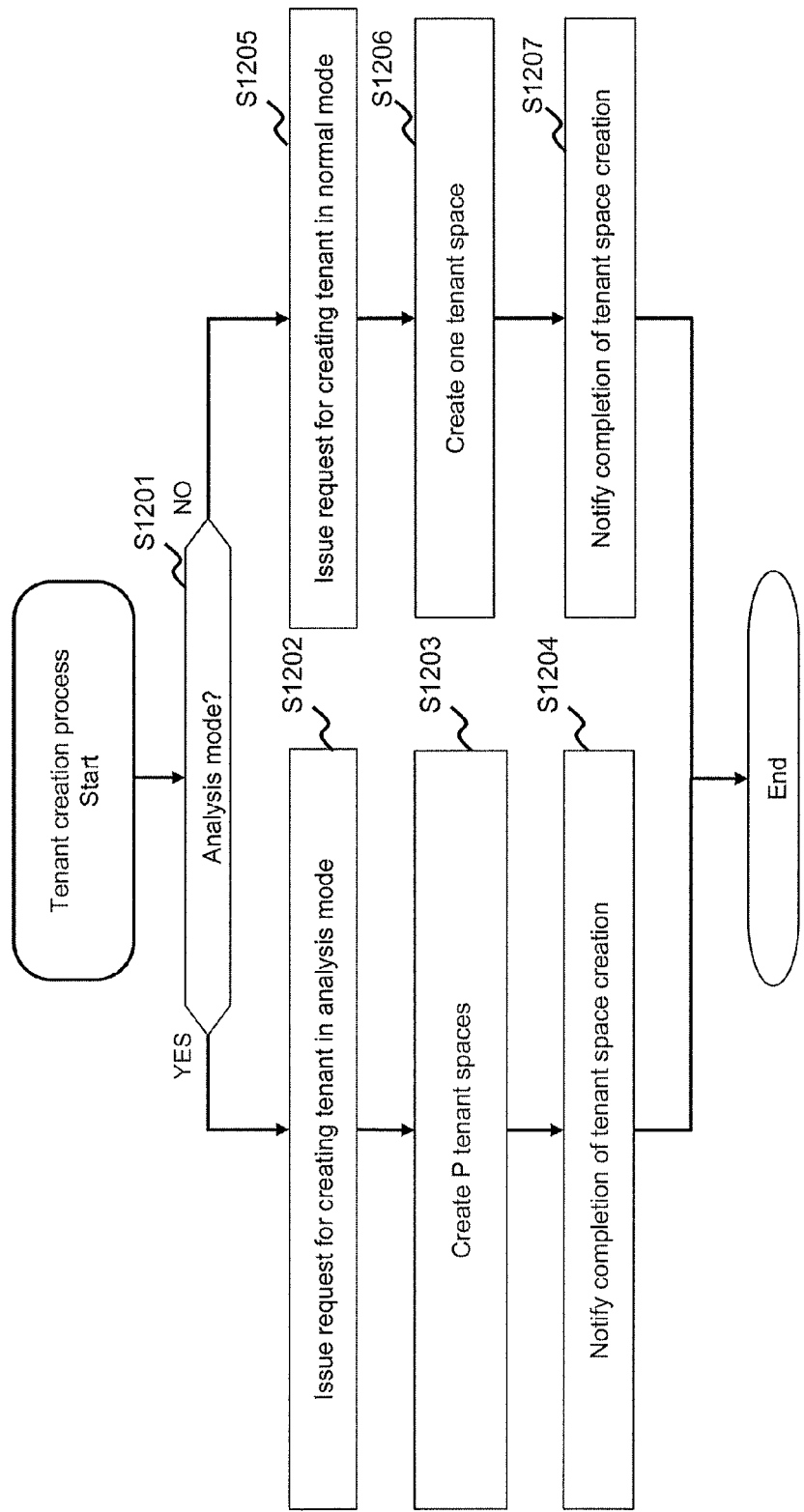
FIG. 12 is a flowchart of a tenant space creation process.

FIG. 12 is a flowchart of a tenant space creation process.

The tenant space creation process is a process of creating a tenant space in the object storage system 400. The tenant space creation process may be started when the object storage management program 520 receives a tenant space creating instruction from a manager (an operator of the management computer 500). The tenant space creating instruction contains a first designation (e.g., designation of the analysis mode, the tenant name, and the data protection level) or a second designation (e.g., designation of the normal mode and the tenant name). Here, "analysis mode" is a mode for creating Y tenant spaces having a length of Q (quotient of WY) based on the number of nodes N and the data protection level Y. The "normal mode" is a mode for creating a tenant space that extends over all the nodes irrespective of the data protection level. In this Embodiment, the number of nodes N is the number of nodes that constitute the object storage system 400. Instead of this number, the number may be a value designated by the user as the number of the nodes per tenant.

The object storage management program 520 determines whether the designated creating mode is "analysis mode" or not (S1201). If the determination result in S1201 is affirmative (S1201: YES), the object storage management program 520 transmits the creating mode designated by the user (analysis mode), and a tenant space creating request that designates the tenant space name and the data protection level, to the object storage system 400 (S1202). In response to the creating request, the object storage program 410 creates Y tenant spaces on different Y node groups (Q nodes (quotient Q=N/Y)) for the tenant associated with the designated tenant name; the tenant space name of each tenant space is a name made by adding a serial number (an integer up to the data protection level) to the end of the designated tenant name (S1203). The object storage program 410 then notifies the object storage management program 520 of completion of tenant space creation (S1204). Upon receipt of the notification of the completion of tenant space creation, the object storage management program 520 finishes the tenant space creation process.

If the determination result in S1201 is negative (S1201: NO), the object storage management program 520 transmits the creating mode designated by the user (normal mode), and a tenant space creation request that designates the tenant name (S1205). In response to the creating request, the object storage program 410 creates a tenant space that extends over all the nodes of the object storage system 400 for the tenant associated with the designated tenant name; the tenant space has the same name as the designated tenant name does (S1206). The object storage program 410 notifies the object storage management program 520 of completion of tenant space creation (S1207). Upon receipt of the notification of the completion of tenant space creation, the object storage management program 520 finishes the tenant space creation process.

According to the tenant space creation process in FIG. 12, for example, in a case where the number of nodes N=32, the creating mode is "analysis mode", the tenant name is "tenantA", and the data protection level is "3", a tenant space "tenantA_#1" based on the nodes #01 to #10, a tenant space "tenantA_#2" based on the nodes #11 to #20, and a tenant space "tenantA_#3" based on the nodes #21 to #30 are created. The length of one of the three tenant spaces may be "12". The length(s) of one or two of the three tenant spaces may be "11". That is, it is unnecessary that the lengths of all the tenant spaces are equally "10" (Quotient Q of N/Y). Alternatively, the remaining nodes may be based on one or more tenant spaces.

Figure 13:
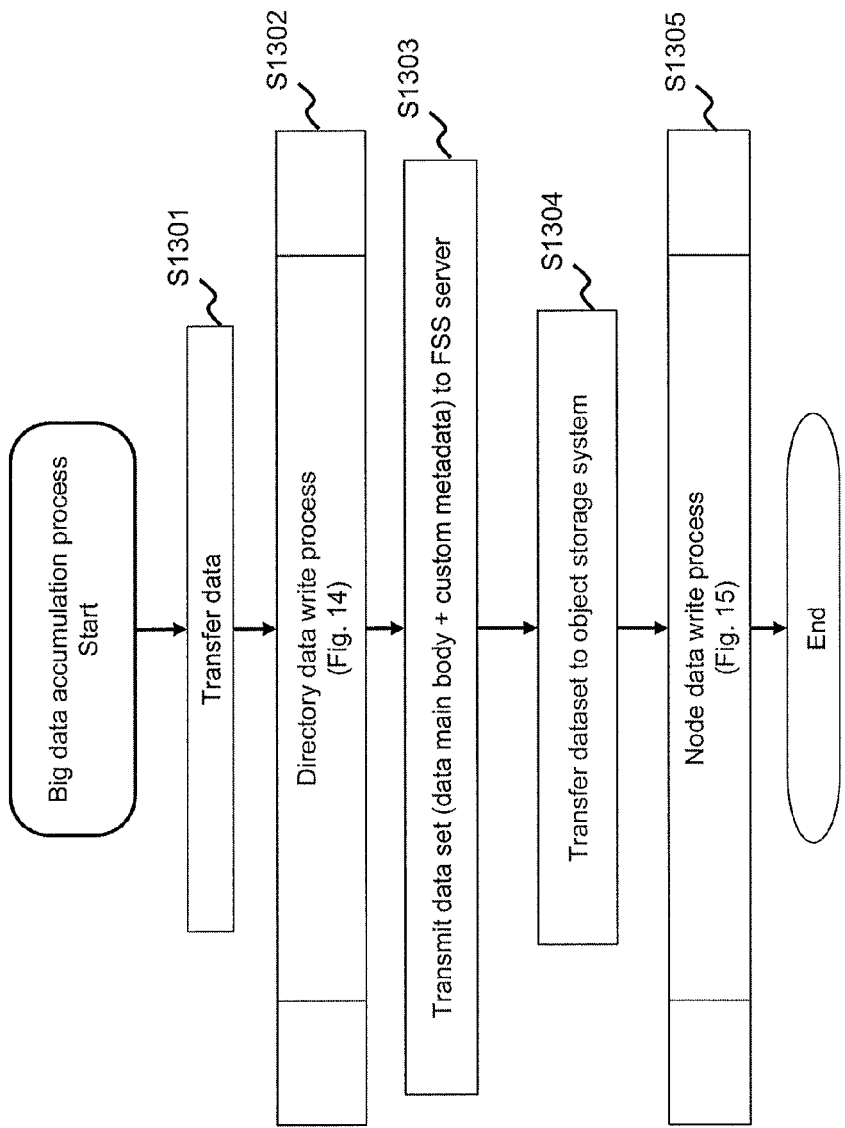
FIG. 13 is a flowchart of a big data accumulation process.

FIG. 13 is a flowchart of a big data accumulation process.

The big data accumulation process is a process up to writing data that contains values obtained by the sensors (the smart meters 101 and temperature sensor 102) into the object storage system 400.

The sensor transfers the data containing the measured value to the APP for the sensors (the APP 210 for the smart meters or the APP 220 for the temperature sensor) (S1301).

Next, the APP for the sensors executes the directory data write process that writes data in the individual directories in the FSS directory 235 (see FIG. 14) (S1302).

Next, the FSS client APP 230 refers to the storage management table 2310, adds the addition custom metadata 2312 associated with the individual directory to which the data has been written, to the data (data main body) to be stored in the individual directory, and transfers the data set containing the data main body and the custom metadata to the FSS server 300 (the FSS server 300 identified on the basis of the FSS server name 2313 associated with the individual directory) (S1303). The appropriate custom metadata can thus be added to the data main body to be transmitted to the object storage system 400.

Next, the FSS server program 310 of the FSS server 300 refers to the storage-destination tenant management table 3110, identifies the object storage system 400 and the tenant space 430 that are the storage destination of the received data main body (the object storage name 3113 and the tenant space name 3114), and transmits the write request that designates the identified tenant space name (the write request where the data set is the write target) to the identified object storage system 400 (S1304).

Next, in response to the write request, the object storage program 410 of the object storage system 400 executes the node data write process (see FIG. 15) that writes, into the tenant space, the data main body in the data set that is the write target (S1305).

Figure 14:
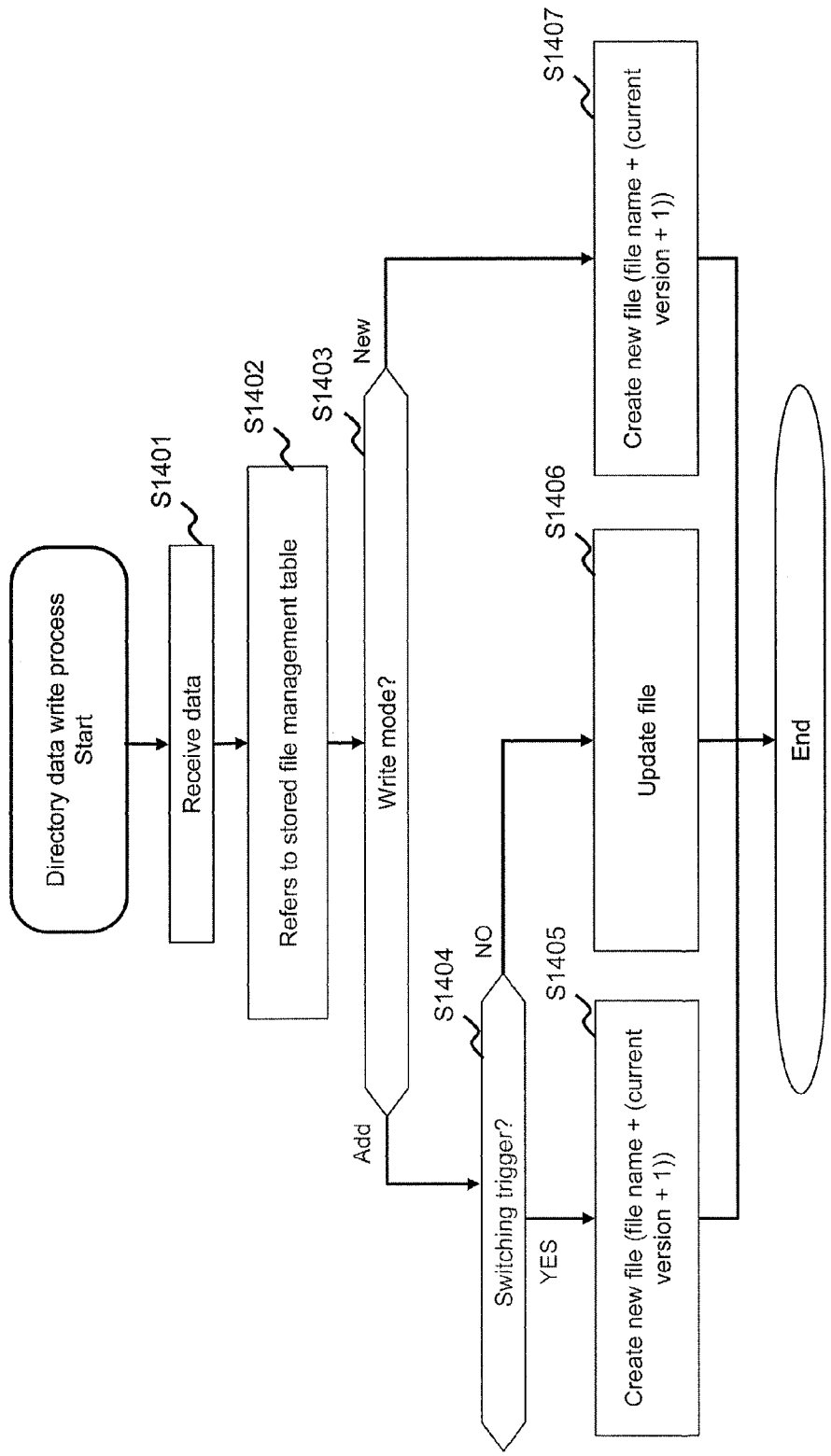
FIG. 14 is a flowchart of a directory data write process.

FIG. 14 is a flowchart of a directory data write process.

The APP for the sensors receives the data from the sensors (101 and 102), and accumulates the data in the cache area (S1401). Next, the APP for the sensors refers to the stored file management table 2110 (S1402), and refers to the setting configuration of the write mode 2116 associated with the transmission-source sensor (S1403).

When the write mode 2116 being referred to is "Add" (S1403: Add), the APP for the sensors determines whether the current time point corresponds to the file switching trigger 2117 associated with the transmission-source sensor or not (S1404). When the determination result in S1404 is affirmative (S1404: YES), the APP for the sensors newly creates a file whose file name is a combination of the file name 2114 associated with the transmission-source sensor and a value obtained by adding one to the current version 2115 associated with the transmission-source sensor, in the individual directory associated with the transmission-source sensor (the directory indicated by the data storage destination directory 2311 associated with the transmission-source sensor), and writes the write-target data main body in the file (S1405). When the determination result in S1404 is negative (S1404: NO), the APP for the sensors writes the write-target data in the current file associated with the transmission-source sensor (S1406).

When the write mode 2116 being referred to is "New" (S1403: New), the APP for the sensors newly creates a file whose file name is a combination of the file name 2114 associated with the transmission-source sensor and a value obtained by adding one to the current version 2115 associated with the transmission-source sensor, in the individual directory associated with the transmission-source sensor (the directory indicated by the data storage destination directory 2311 associated with the transmission-source sensor), and writes the write-target data main body in the file (S1407).

Figure 15:
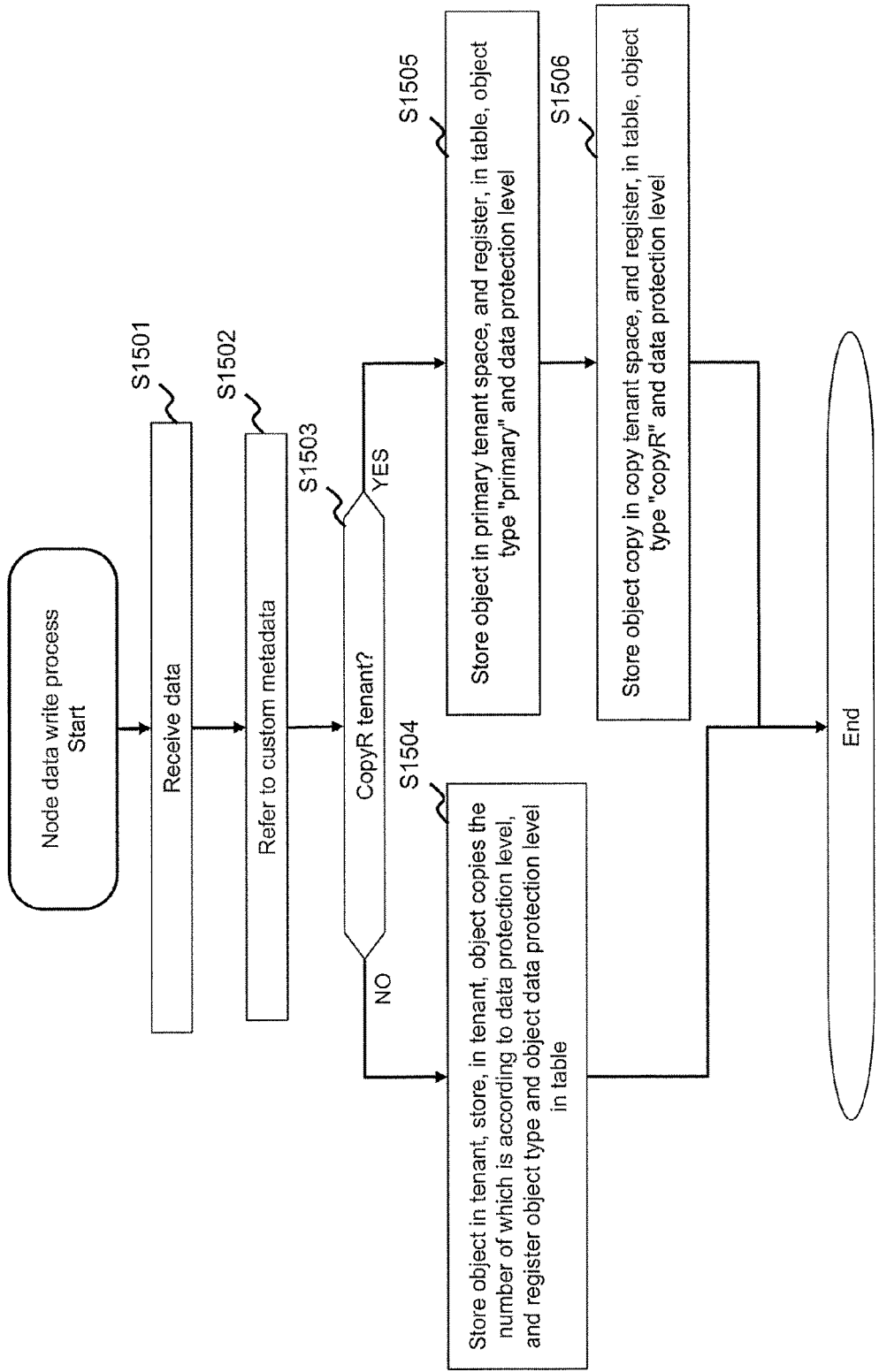
FIG. 15 is a flowchart of a node data write process.

FIG. 15 is a flowchart of a node data write process.

The object storage program 410 receives, from the FSS server 300, the data set of the object (the set containing the data main body and the custom metadata) (S1501).

Next, the object storage program 410 refers to the custom metadata on the received data, and determines whether the custom metadata contains "CopyR Tenant" (R is an integer of one or more) or not (S1503).

When the determination result in S1503 is negative (S1503: NO), the object storage program 410 stores object (data main body) in the tenant space corresponding to the designated tenant space name, and writes the object type 4113 associated with the object, the data protection level 4114 (e.g., the data protection level identified from the added custom metadata) and the custom metadata 4117 (S1504). In S1504, in a case where the designated data protection level Y (e.g., the data protection level identified from the added custom metadata) is two or more, the object storage program 410 creates (Y−1) copied objects and stores the created copied objects in the identical tenant space.

On the other hand, when the determination result in S1503 is affirmative (S1503: YES), the object storage program 410 stores the object in the primary tenant space identified from the added custom metadata, and writes the object type 4113 "primary" associated with the object, and the data protection level 4114 (e.g., the data protection level identified from the added custom metadata) (S1505). Next, the object storage program 410 stores the copied object in the copied tenant space ("CopyR Tenant") identified from the added custom metadata, and registers the object type 4113 "CopyR" and the data protection level 4114 that are associated with the object (S1506).

According to the node data write process, in a case where the added custom metadata contains "CopyR Tenant", the Y-time multiplexed objects are stored in the respective Y tenant spaces. Consequently, the same object can be loaded to the Hadoop system 600 from any node group (Q nodes) on which the corresponding tenant space is based. Consequently, the object can be loaded to the Hadoop system 600 from a tenant space based on the node Group other than the node group (tenant space) in loading. Thus, reduction in loading time can be expected.

Figure 16:
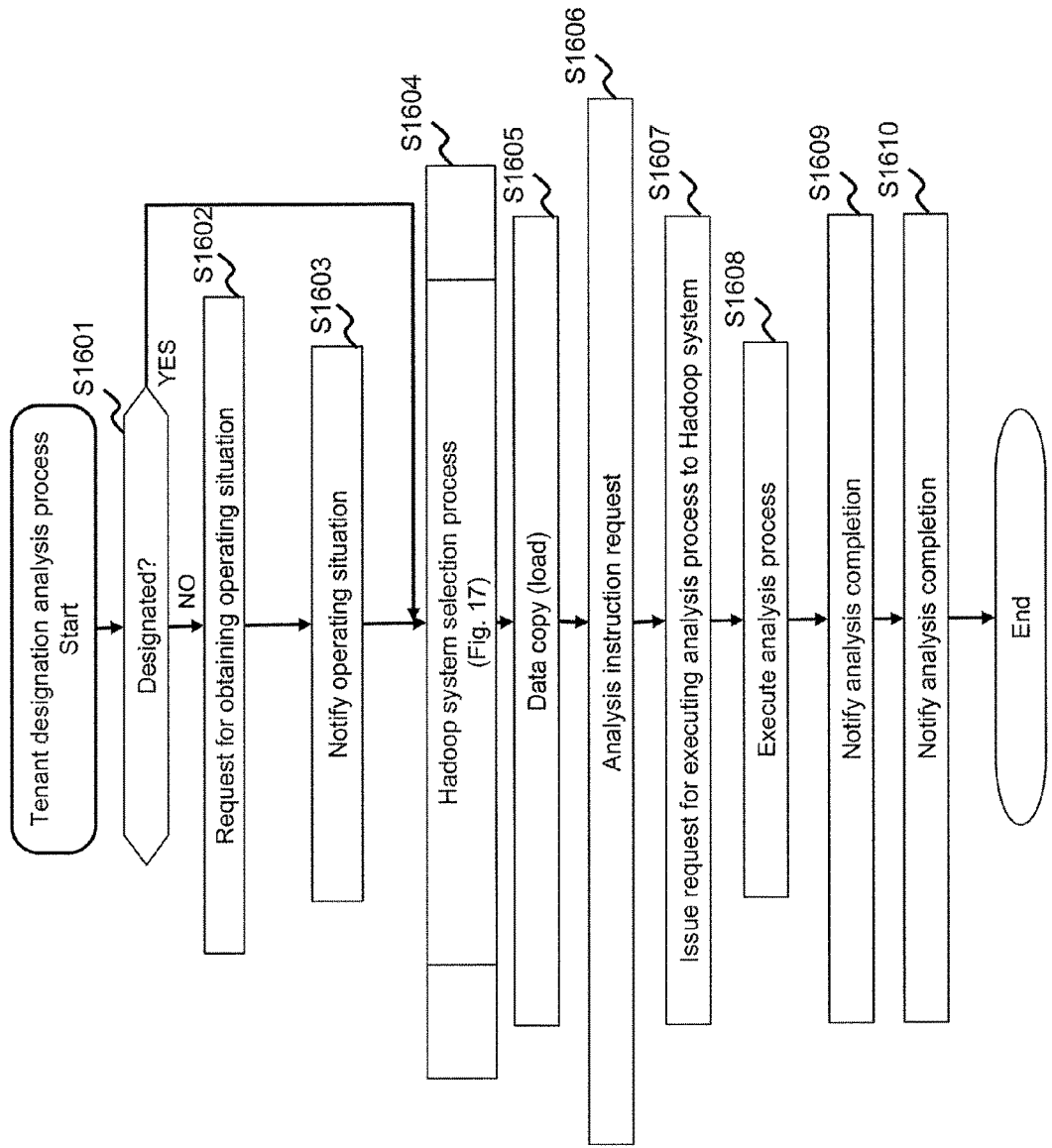
FIG. 16 is a flowchart of a tenant designation analysis process.

FIG. 16 is a flowchart of a tenant designation analysis process.

The tenant designation analysis process may be executed when the dataflow management program 540 of the management computer 500 receives designation of analysis target data (e.g., "tenantA_#1") from the manager.

The dataflow management program 540 determines whether the Hadoop system 600 is designated or not (S1601).

When the determination result in S1601 is negative (S1601: NO), the dataflow management program 540 issues a request for obtaining the operating situation of the Hadoop system 600 to the Hadoop management program 560 (S1602). In response to the request, the Hadoop management program 560 refers to the Hadoop situation table 5610, thereby identifying the operating situation of each Hadoop system, and notifies the dataflow management program 540 of the identified operating situation (S1603).

After the process in S1603 or when the determination result in S1601 is affirmative (S1601: YES), the dataflow management program 540 executes the Hadoop system selection process (see FIG. 17) that selects the Hadoop system 600 that has the lowest load or has been designated by the user (S1604).

Next, the dataflow management program 540 copies (loads) the object group in the designated tenant space (e.g., all the objects (object data main bodies) in the designated tenant space), to the HDFS 620 of the selected Hadoop system 600 (S1605). After the copy is completed, the dataflow management program 540 transmits the analysis instruction request that designates the Hadoop system 600 to the Hadoop management program 560 (S1606).

In response to the analysis instruction request, the Hadoop management program 560 transmits an analysis process executing instruction to the Hadoop system 600 designated by the analysis instruction request (S1607). In response to the execution instruction, the Hadoop system 600 executes the analysis process designated by the execution instruction (S1608), and notifies the Hadoop management program 560 of the completion of the analysis after the analysis process is completed (S1609). The Hadoop management program 560 notifies the dataflow management program 540 of the completion of the analysis (S1610).

Figure 17:
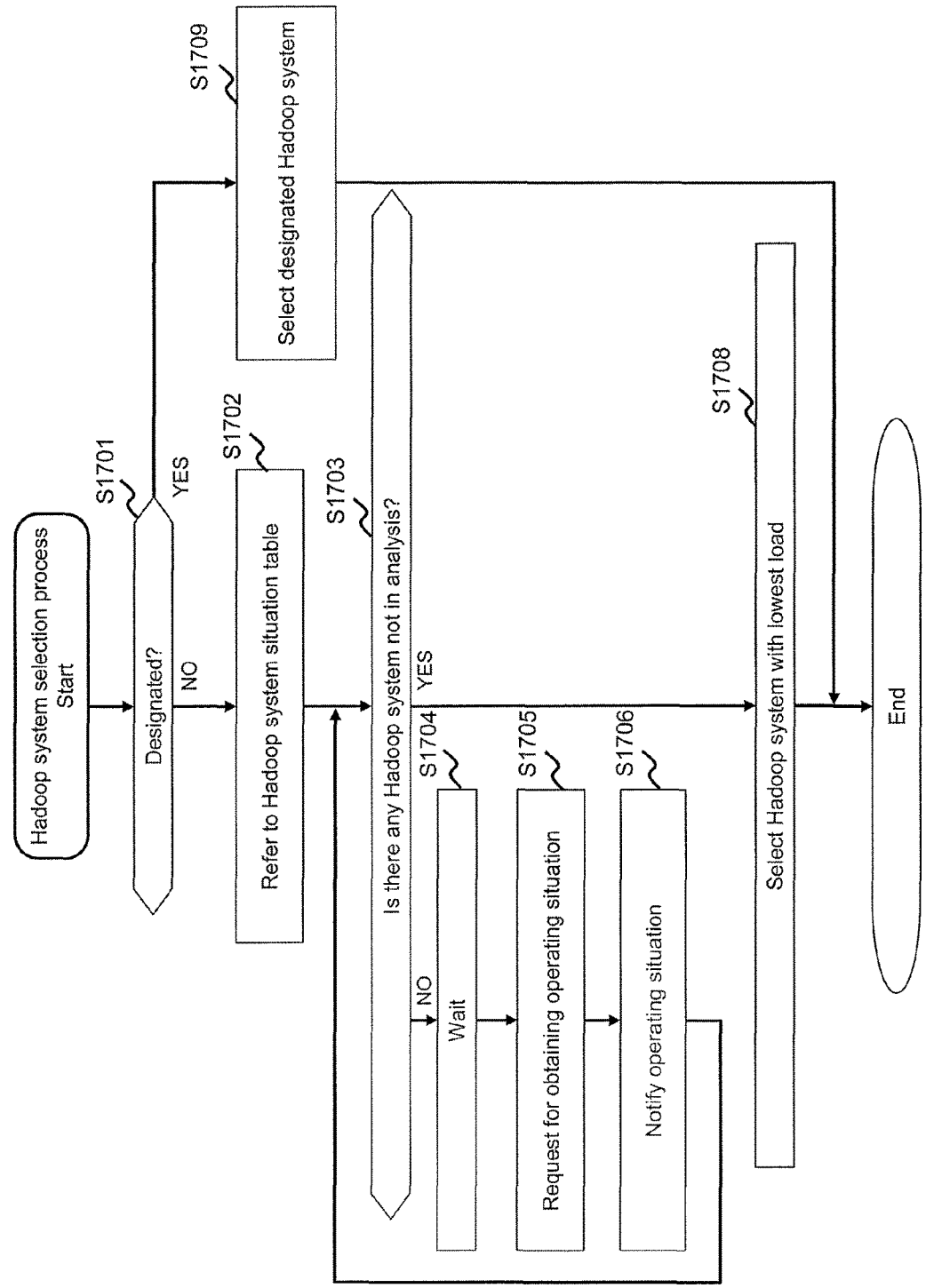
FIG. 17 is a flowchart of a Hadoop system selection process.

FIG. 17 is a flowchart of a Hadoop system selection process.

The dataflow management program 540 determines whether the Hadoop system 600 is designated or not (S1701).

When the determination result in S1701 is negative (S1701: NO), the dataflow management program 540 refers to the operating situation (the operating situation of each Hadoop system 600) received from the Hadoop management program 560 (S1702), and determines whether any Hadoop system 600 that is not in analysis is present or not (S1703).

When the determination result in S1703 is negative (S1703: NO), the dataflow management program 540 waits for an analysis completion notification from the Hadoop management program 560 (S1704). Subsequently, upon receipt of the analysis completion notification, the dataflow management program 540 issues a request for obtaining the operating situation of each Hadoop system 600 to the Hadoop management program 560 (S1705). The Hadoop management program 560 having received the request notifies the dataflow management program 540 of the operating situation of each Hadoop system on the basis of the Hadoop situation table 5610 (S1706). Subsequently, the dataflow management program 540 executes the process in S1703.

On the other hand, when the determination result in S1703 is affirmative (S1703: YES), the dataflow management program 540 writes the name of the Hadoop system 600 having the lowest load among the Hadoop systems 600 not in analysis, as the copy-destination Hadoop system name 5413 associated with the copy-source tenant space (designated tenant space), and sets the status 5415 associated with the copy-source tenant space to "In-copying" (S1708). Consequently, the Hadoop system 600 having the lowest load among the Hadoop systems 600 that are not in analysis can be designated as the data load destination.

When the determination result in S1701 is affirmative (S1701: YES), the dataflow management program 540 writes the name of the designated Hadoop system 600 as the copy-destination Hadoop system name 5413 associated with the copy-source tenant space, and sets the status 5415 associated with the copy-source tenant space to "In-copying" (S1709).

Figure 18:
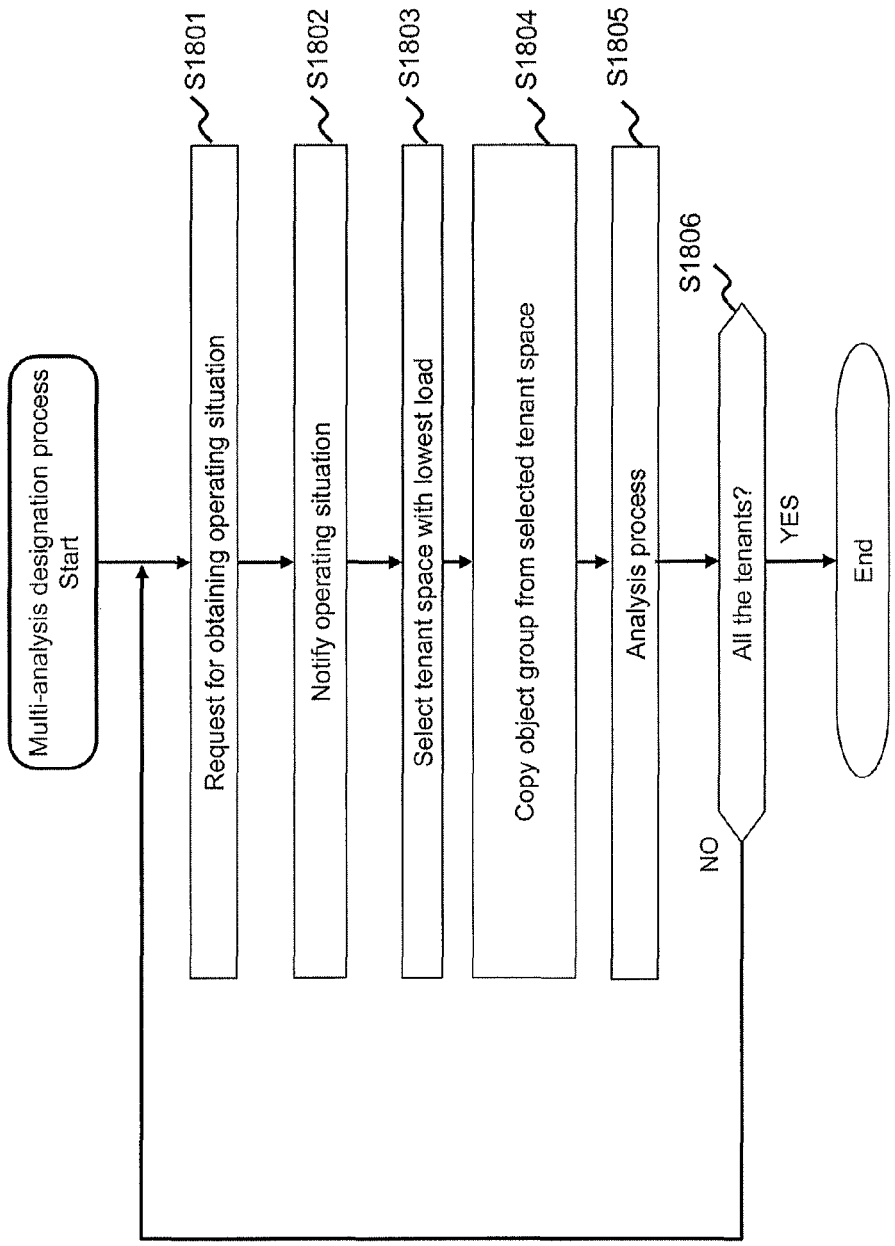
FIG. 18 is a flowchart of a multi-analysis designation process.

FIG. 18 is a flowchart of a multi-analysis designation process.

The dataflow management program 540 of the management computer 500 can receive, from the manager, designation that the manager wishes to analyze pieces of data of the respective tenants (e.g., "tenantA" and "tenantB") separately.

In receipt of such designation, the dataflow management program 540 issues a request for obtaining the operating situation of the Hadoop system 600 to the Hadoop management program 560 (S1801). In response to the request, the Hadoop management program 560 refers to the Hadoop situation table 5610, thereby identifying the operating situation of each Hadoop system, and notifies the dataflow management program 540 of the identified operating situation (S1802).

Next, the dataflow management program 540 selects the tenant space having the lowest load (correctly, the tenant space on which the node group having the lowest load is based) among the tenant spaces of the tenants designated from the manager (S1803). Thus, the load of any specific node group is allowed not to become high. The dataflow management program 540 designates the selected tenant space (S1804), starts the tenant designation analysis process (FIG. 16) (S1805), and determines whether all the designated tenant spaces have been analyzed or not (S1806). S1806 may be performed without finishing the process in FIG. 16 started in S1805.

When the determination result in S1806 is affirmative (S1806: YES), the dataflow management program 540 finishes the process. When the determination result in S1806 is negative (S1806: NO), the dataflow management program 540 performs S1801 for unprocessed tenants.

According to the multi-analysis designation process, for example, in the case where the tenants A and B are designated, the object group in the tenant space "tenantA_#1" is loaded to the Hadoop system #1, and the object group in the tenant space "tenantB_#2" is loaded to the Hadoop system #2. That is, the object groups are loaded from the different node groups to the different Hadoop systems 600 in parallel. Thus, reduction in loading time can be expected.

According to the multi-analysis designation process, in a case where a tenant C is further designated and the node group based on the tenant space (e.g., "tenantC_#1") having the lowest load with respect to the tenant C is nodes #1 to #05 based on the tenant space "tenantA_#1", completion of analysis through use of the object group loaded from the tenant space "tenantA_#1" to the Hadoop system #1 is waited for, and the object group may be loaded from the tenant space "tenantC_#1" to the Hadoop system #1 after this completion of analysis.

In this Embodiment, all or some of the object groups already stored in the object storage system 400 are rearranged, thereby also allowing the loading time to the Hadoop system 600 to be reduced.

Figure 19:
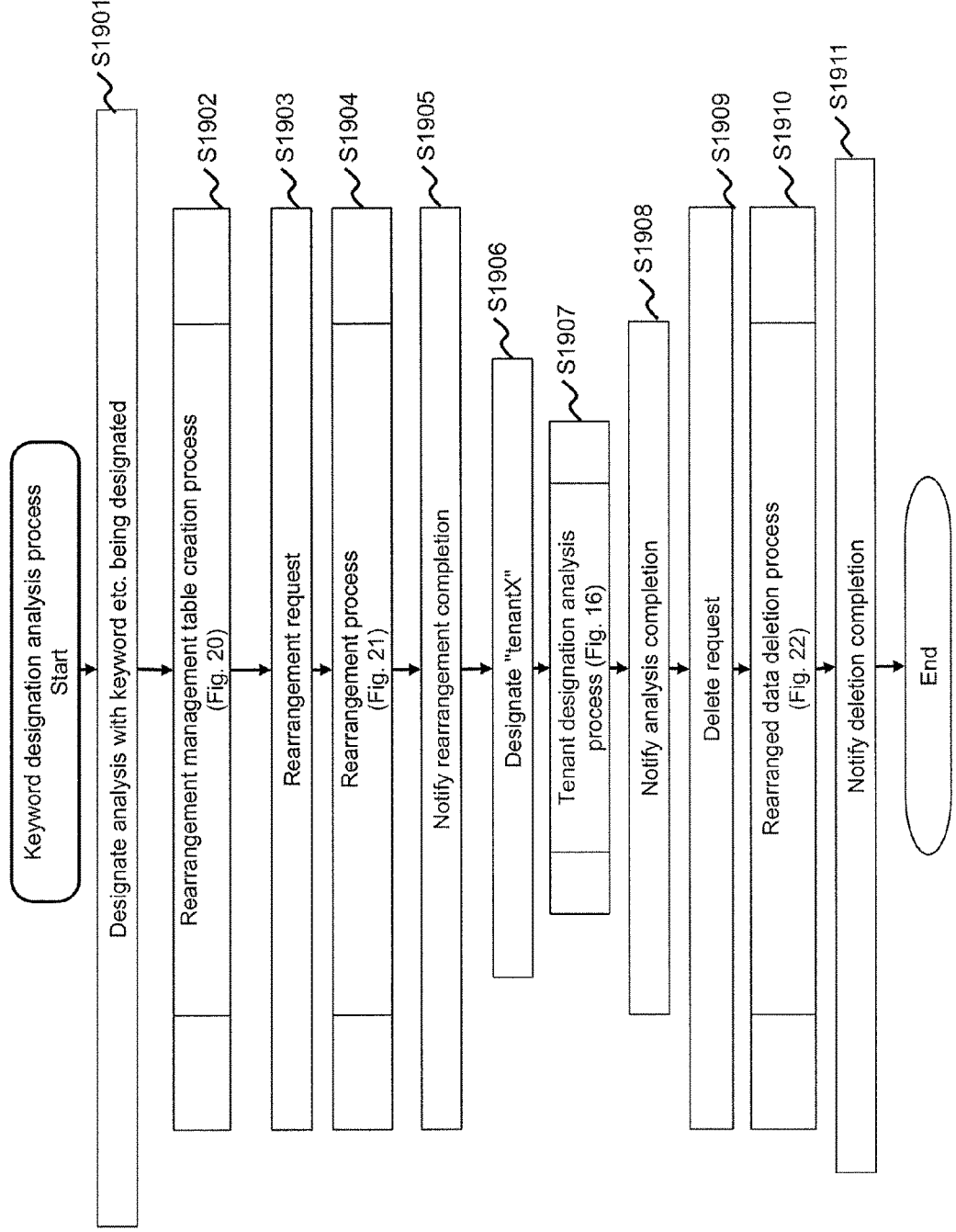
FIG. 19 is a flowchart of a keyword designation analysis process.

FIG. 19 is a flowchart of a keyword designation analysis process.

The dataflow management program 540 of the management computer 500 can accept "keyword" identifying data to be analyzed, and "search range (e.g., multiple tenant names)", and accept designation of analysis of data containing designation of the tenant ("tenantX") that is rearrangement destination to which the object (data) is rearranged. The "tenantX" is the common space 430X described above, and the common space 430X can be used as a tenant space for rearrangement. The common space 430X is a tenant space based on nodes (e.g., all the nodes 420) the number of which is more than the number of those in one tenant space of one tenant.

The dataflow management program 540 receives, from the user, data analysis designation that contains "keyword", "search range", and "tenantX", and issues a request for rearrangement that contains "keyword", "search range" and "tenantX" to the rearrangement management program 550 (S1901). In response to the request, the rearrangement management program 550 executes the rearrangement management table creation process (see FIG. 20) (S1902).

Next, the rearrangement management program 550 transmits, to the object storage system 400, a rearrangement request that contains the created rearrangement management table 5510 (e.g., its copy) (S1903).

In response to the rearrangement request, the object storage system 400 executes the rearrangement process (see FIG. 21) (S1904).

After the rearrangement process is finished, the rearrangement management program 550 notifies the dataflow management program 540 of the completion of rearrangement (S1905).

The dataflow management program 540 designates "tenantX" as an analysis target (S1906), and starts the tenant designation analysis process (see FIG. 16) (S1907).

After the tenant designation analysis process is finished, the dataflow management program 540 notifies the rearrangement management program 550 of the completion of analysis (S1908). The rearrangement management program 550 transmits, to the object storage system 400, a deletion request that contains the rearrangement management table 5510 (e.g., its copy) (S1909).

In response to the deletion request, the object storage system 400 executes the rearranged data deletion process (see FIG. 22) (S1910). After the rearranged data deletion process is finished, the rearrangement management program 550 notifies the dataflow management program 540 of completion of deletion of the rearranged data (S1911), and the dataflow management program 540 finishes the process.

Figure 20:
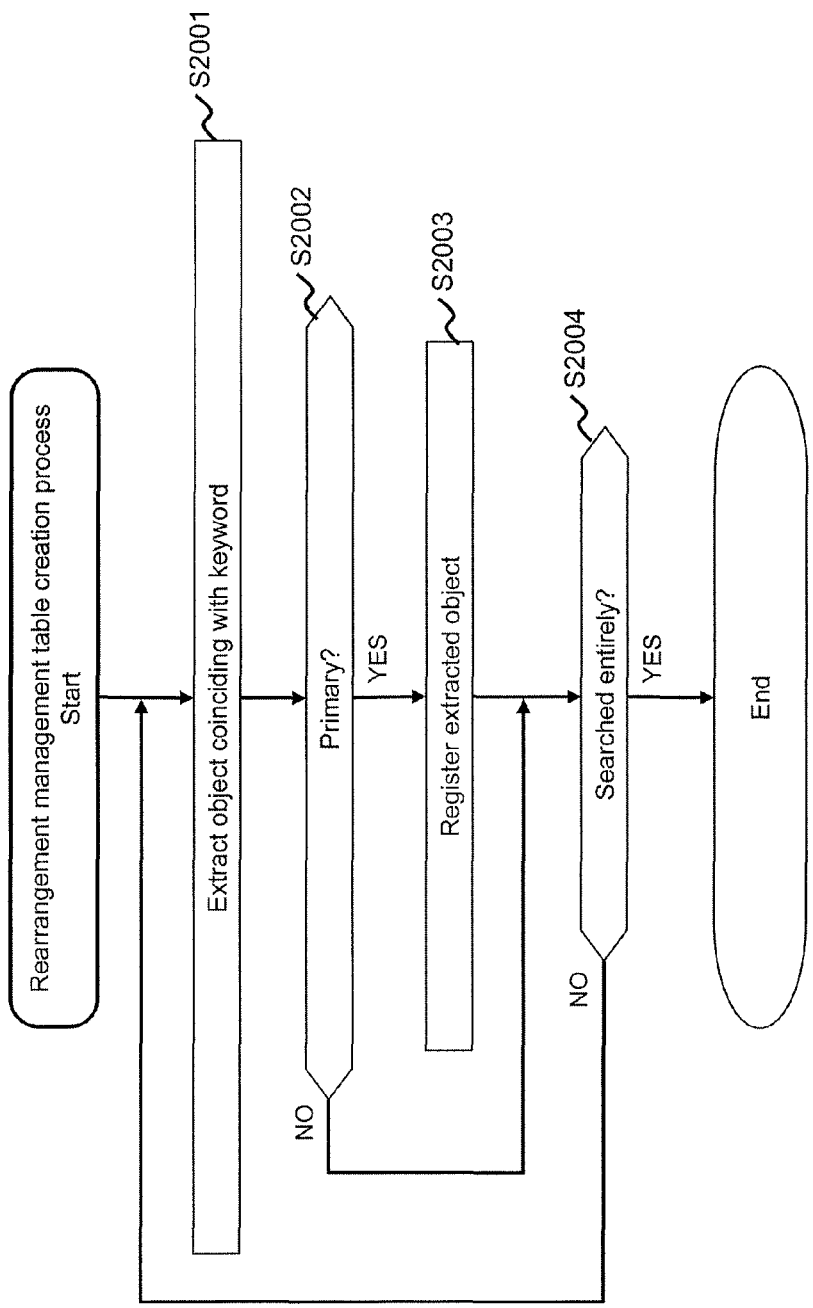
FIG. 20 is a flowchart of a rearrangement management table creation process.

FIG. 20 is a flowchart of a rearrangement management table creation process.

The rearrangement management program 550 identifies metadata that contains a keyword coinciding with the designated "keyword" on the basis of the metadata (custom metadata) on the object in the search range, and extracts the object associated with the identified metadata (S2001).

Next, the rearrangement management program 550 determines whether the object type 4113 of the extracted object is "primary" or not (S2002). When the determination result in S2002 is negative (S2002: NO), the rearrangement management program 550 proceeds the processing to S2004. On the other hand, when the determination result in S2002 is affirmative (S2002: YES), the rearrangement management program 550 writes, into the rearrangement management table 5510, information associated with the extracted object (e.g., the object name 5511, primary 5512, first copy 5513, second copy 5514, and original DPL 5515) (S2003), and proceeds the processing to S2004. In the column having the largest R of the R-th copy, the tenant space "tenantX" of the common space 430X is registered. This is because the common space 430X is the tenant space for rearrangement. The reason for determination in S2002 is for the sake of preventing the same object from being redundantly copied (rearranged) in the common space 430X. More specifically, because of the determination in S2002, the object associated with "primary" (original object) is copied to the common space 430X. However, the object (copied object) associated with "copy1" or the like is not copied to the common space 430X.

In S2004, the rearrangement management program 550 determines whether the entire search range has been searched or not (S2004). In a case where the determination result in S2004 is negative (S2004: No), the processing proceeds to S2001. On the other hand, when the determination result in S2004 is affirmative (S2004: YES), the processing is finished.

According to the rearrangement management table creation process, information pertaining to the object corresponding to the designated keyword is registered in the rearrangement management table 5510.

Figure 21:
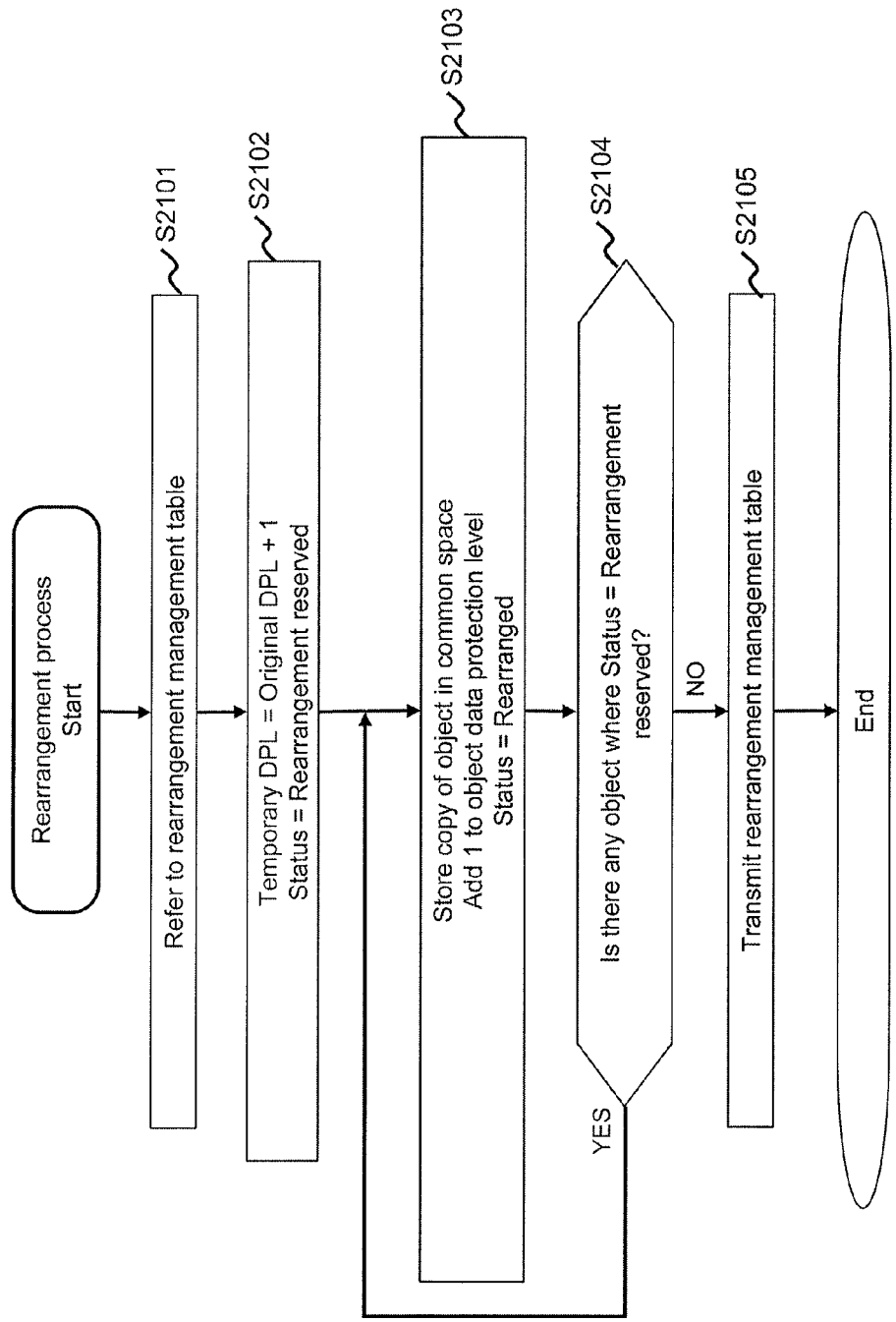
FIG. 21 is a flowchart of a rearrangement process.

FIG. 21 is a flowchart of a rearrangement process.

The object storage program 410 refers to the rearrangement management table 5510 from the rearrangement management program 550 (S2101). The object storage program 410 changes the status 5517 "Null" (available) in the rearrangement management table 5510 to "Rearrangement reserved", and registers, as the temporary DPL 5516, a value obtained by adding one to the original DPL 5515 (S2102).

Next, the object storage program 410 stores the copy of the object associated with the status 5517 "Rearrangement reserved" in the common space 430X (i.e., the tenant space associated with the tenant space name with the field having the largest value "R" of "CopyR Tenant"), adds one to the object data protection level 4114 associated with the object, and updates the status 5517 associated with the object to "Rearranged" (S2103). Thus, also for the common space 430X (the tenant space for rearrangement), management analogous to that of the copied tenant space is performed. Accordingly, irrespective of the number of copies of the same object (file), the multiplexed object can be provided as a single object (file) for an external apparatus.

Next, the object storage program 410 determines whether or not there is any object associated with the status 5517 "Rearrangement reserved" (S2104). When the determination result in S2104 is affirmative (S2104: YES), the processing proceeds to S2103.

On the other hand, when the determination result in S2014 is negative (S2104: NO), the object storage program 410 transmits the created rearrangement management table 5510 to the rearrangement management program 550 (S2105).

According to the rearrangement process, the copy of the object coinciding with the keyword is stored in the common space 430X.

Figure 22:
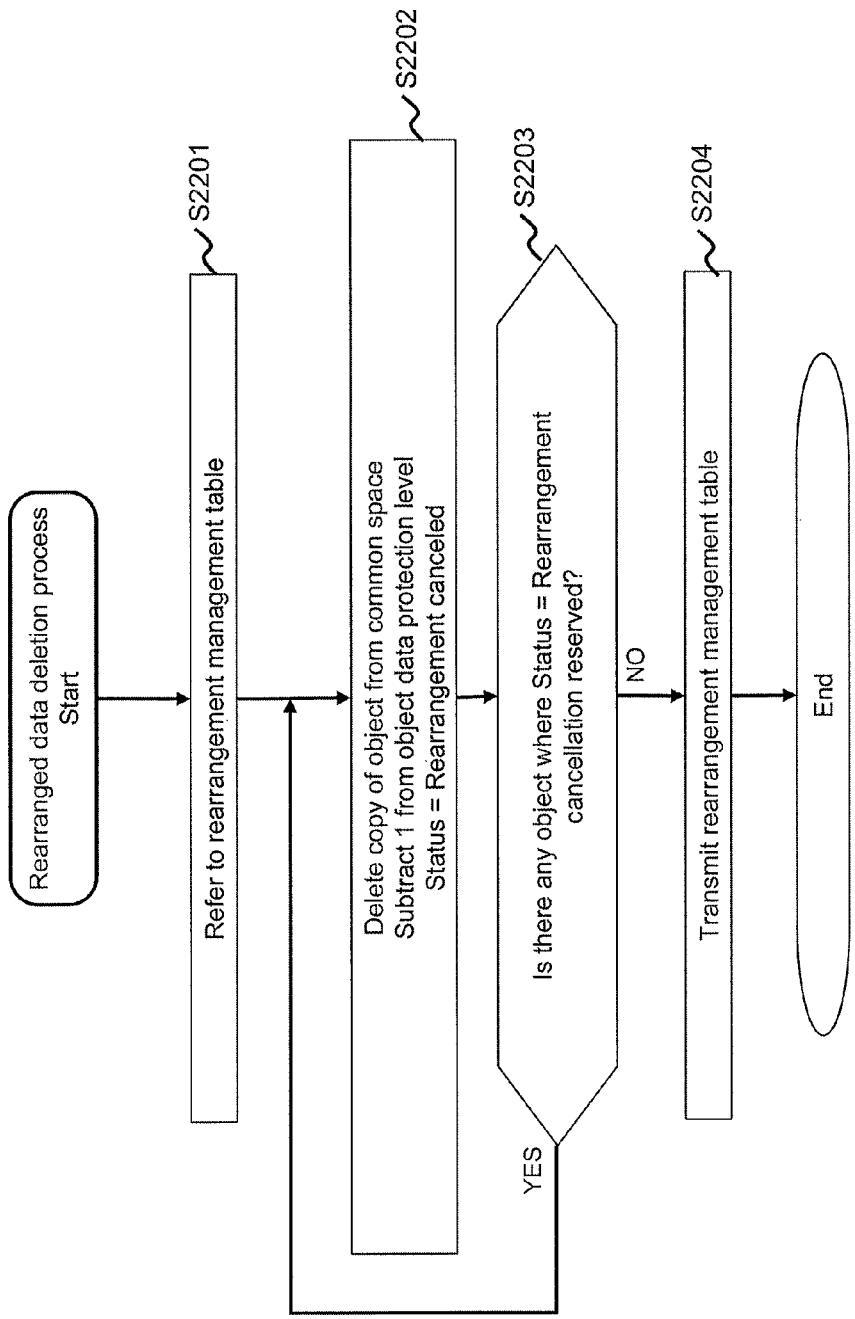
FIG. 22 is a flowchart of a rearranged data deletion process.

FIG. 22 is a flowchart of a rearranged data deletion process.

The object storage program 410 refers to the rearrangement management table 5510 received from the rearrangement management program 550 (S2201). The object storage program 410 deletes, from the common space 430X, the copy of the object associated with the status 5517 "Rearrangement cancellation reserved", subtracts one from the object data protection level 4114 associated with the object, and updates the status 5517 associated with the object to "Rearrangement canceled" (S2202).

Next, the object storage program 410 determines whether or not there is any object associated with the status 5517 "Rearrangement cancellation reserved" (S2203). When the determination result in S2203 is affirmative (S2203: YES), the processing proceeds to S2202.

On the other hand, when the determination result in S2203 is negative (S2203: NO), the object storage program 410 transmits the rearrangement management table 5510 to the rearrangement management program 550 (S2204).

Embodiment has thus been described. However, the present invention is not limited by this Embodiment. It is a matter of course the present invention can be variously modified in a range without departing from the gist. For example, the Hadoop system 600 may reside in the data center system 2 or out of the system. For example, even when the analysis process is performed using the object in the common space 430X, any object is allowed not to be deleted from the common space 430X. In other words, in a case of possibility that the object in the common space 430X is reused, the object may remain in the common space 430X for a certain time. In a waiting time (vacant time) during which the Hadoop system 600 performs data analysis for data that is the next analysis target in the Hadoop system 600, the keyword designation analysis process may be executed. The object may be made redundant by the FSS server 300 or by the object storage system 400 on the basis of the object stored in the primary tenant space. The process of determining the storage destination tenant space of the data main body on the basis of the custom metadata added to the data main body may be performed at least one of the FSS server 300 and the object storage system 400.

REFERENCE SIGNS LIST

2: Data center system, 400: Object storage system, 500: Management computer, 600: Hadoop system

The invention claimed is:

1. A computer system, for reducing data loading time comprises:
   a processor;
   an I/O interface;
   a storage system, comprising a memory, including N nodes (N is an integer, equal to or larger than 2) communicatively coupled with the processor and I/O interface; and
   one or more data processing systems communicatively coupled with the storage system,
   the storage system being configured to provide a plurality of tenant spaces that are a plurality of storage spaces based on the N nodes and store a plurality of data units of a plurality of tenants,
   the plurality of tenant spaces containing Y1 tenant spaces (Y1 is an integer, equal to or larger than 2 and equal to or smaller than N) for a first tenant, the Y1 tenant spaces based on Y1 node groups among the N nodes, and each of the Y1 node groups containing Q1 or more nodes (Q1 is an integer, equal to or larger than 1), wherein Q1 is a quotient of N/Y1, and
   the processor being configured to
      for the first tenant, arrange Y1-time multiplexed data units in the Y1 tenant spaces in the storage system, and
      from a first load-source tenant space from among the Y1 tenant spaces in the storage system, load a first data unit group which contains one or more data units from the storage system to a first load-destination data processing system among the one or more data processing systems.

2. The computer system according to claim 1, wherein the plurality of tenant spaces further contain Y2 tenant spaces for a second tenant (Y2 is an integer, equal to or larger than 2 and equal to or smaller than N), the Y2 tenant spaces are based on Y2 node groups among the N nodes, and each of the Y2 node groups is made up of Q2 or more nodes (Q2 is a quotient of N/Y2), and
the processor is configured to
   for the second tenant, arrange Y2-time multiplexed data units in the Y2 tenant spaces in the storage system, and
   from a second load-source tenant space among the Y2 tenant spaces in the storage system, load a second data unit group which contains one or more data units from the storage system to a second load-destination data processing system among the one or more data processing systems.

3. The computer system according to claim 2, wherein the second load-destination data processing system is a data processing system other than the first load-destination data processing system, and
irrespective of whether loading of the first data unit group from the first load-source tenant space to the first load-destination data processing system has been completed or not and whether the first load-destination data processing system has completed data processing using the first data unit group, the processor is configured to load the second data unit group from the second load-source tenant space to the second load-destination data processing system.

4. The computer system according to claim 2, wherein the first and second load-source tenant spaces are tenant spaces each selected by the processor, and
the processor, is configured to select, as a load source, a tenant space based on a node group with a lowest load.

5. The computer system according to claim 1, further comprising
a server system configured to receive a data unit to which metadata is added,
wherein at least one of the storage system and the server system is configured to determine a tenant space that is an arrangement destination of the Y-time multiplexed data unit, according to whether or not the metadata added to the data unit is custom metadata that defines two or more tenant spaces as the arrangement destination of the data unit.

6. The computer system according to claim 1, wherein the plurality of tenant spaces contain a tenant space common to the plurality of tenants,
the common tenant space is based on nodes the number of which is more than the number of nodes of any node group among the Y1 node groups, and
the processor is configured to copy the first data unit group from any tenant space among the Y1 tenant spaces to the common tenant space, and
to load the first data unit group from any of the Y1 tenant spaces and the common tenant space to the first load-destination data processing system.

7. The computer system according to claim 6, wherein the processor is configured to load the first data unit group, to the first load-destination data processing system, from a node group having a lowest load among the Y1 node groups in the storage system and the node group that stores the first data unit group in the common tenant space.

8. The computer system according to claim 6, wherein the common tenant space is based on the N nodes.

9. The computer system according to claim 6, wherein when the first load-destination data processing system is in data processing, the processor is configured to copy the first data unit group from any tenant space among the Y1 tenant spaces to the common tenant space.

10. The computer system according to claim 1, wherein the first load-destination data processing system is a data processing system selected based on operating situations of the plurality of data processing systems.

11. The computer system according to claim 1, further comprising
a management system for the storage system, wherein the storage system is configured to define the Y1 tenant spaces, for the first tenant, based on an input from the management system.

12. A data management method, for reducing data loading time comprising:

providing, via a storage system comprising a memory communicatively coupled to one or more data processing systems, a plurality of tenant spaces that are a plurality of storage spaces based on N nodes (N is an integer, equal to or larger than 2)

storing, in the storage system, a plurality of data units of a plurality of tenants, wherein the plurality of tenant spaces contain Y1 tenant spaces (Y1 is an integer, equal to or larger than 2 and equal to or smaller than N) for a first tenant, the Y1 tenant spaces are based on Y1 node groups among the N nodes, and each of the Y1 node groups contains Q1 or more nodes (Q1 is an integer, equal to or larger than 2), wherein Q1 is a quotient of N/Y1;

arranging, via a processor communicatively coupled to the storage system, for the first tenant, Y1-time multiplexed data units in each of the Y1 tenant spaces; and loading, via the processor, from a first load-source tenant space among the Y1 tenant spaces, a first data unit group which contains one or more data units to a first load-destination data processing system among the one or more data processing systems.

* * * * *